US012615875B2

(12) United States Patent
Li et al.

(10) Patent No.: US 12,615,875 B2
(45) Date of Patent: Apr. 28, 2026

(54) SOLAR CELL AND FABRICATION METHOD THEREOF

(71) Applicant: LONGI SOLAR TECHNOLOGY (TAIZHOU) CO., LTD., Taizhou (CN)

(72) Inventors: Zhonglan Li, Taizhou (CN); Weiming Lu, Taizhou (CN); Hua Li, Taizhou (CN); Yupeng Jin, Taizhou (CN)

(73) Assignee: LONGI SOLAR TECHNOLOGY (TAIZHOU) CO., LTD., Taizhou (CN)

( * ) Notice: Subject to any disclaimer, the term of this patent is extended or adjusted under 35 U.S.C. 154(b) by 0 days.

(21) Appl. No.: 18/756,116

(22) Filed: Jun. 27, 2024

(65) Prior Publication Data

US 2024/0347656 A1 Oct. 17, 2024

Related U.S. Application Data

(63) Continuation-in-part of application No. PCT/CN2022/092291, filed on May 11, 2022.

(30) Foreign Application Priority Data

Dec. 29, 2021 (CN) .......................... 202111644240.1

(51) Int. Cl.
H10F 77/1223 (2025.01)
H10F 71/00 (2025.01)

(52) U.S. Cl.
CPC ..... H10F 77/1223 (2025.01); H10F 71/1224 (2025.01); H10F 71/129 (2025.01)

(58) Field of Classification Search
None
See application file for complete search history.

(56) References Cited

U.S. PATENT DOCUMENTS

2009/0308457 A1* 12/2009 Smith ..................... H10F 71/00
257/E31.004
2013/0109132 A1* 5/2013 Stewart ................. H10F 77/211
257/E31.124
(Continued)

FOREIGN PATENT DOCUMENTS

CN 105122460 12/2015
CN 105122460 A 12/2015
(Continued)

OTHER PUBLICATIONS

Office Action in Japanese Appln. No. 2024-538152, mailed on Jun. 4, 2025, 7 pages (with English translation).
(Continued)

*Primary Examiner* — Eli S Mekhlin
(74) *Attorney, Agent, or Firm* — Fish & Richardson P.C.

(57) ABSTRACT

The present disclosure discloses a solar cell and methods of fabricating a solar cell. In one aspect, a solar cell includes a substrate, a first doped layer arranged on a first surface of the substrate in a first region of the substrate, and a second doped layer arranged on the first surface of the substrate in a second region of the substrate. The first doped layer includes a first dopant. The second doped layer includes a second dopant. A conductivity type of the second doped layer is opposite to a conductivity type of the first doped layer. The solar cell further includes a third doped layer arranged on the first doped layer. The third doped layer includes the first dopant and the second dopant.

9 Claims, 20 Drawing Sheets

(56) References Cited

U.S. PATENT DOCUMENTS

| | | |
|---|---|---|
| 2016/0284924 A1 | 9/2016 | Bronsveld et al. |
| 2018/0374984 A1 | 12/2018 | Nemeth et al. |
| 2022/0140162 A1 | 5/2022 | Konishi et al. |

FOREIGN PATENT DOCUMENTS

| | | | | |
|---|---|---|---|---|
| CN | 107924957 | 4/2018 | | |
| CN | 115188835 | 10/2022 | | |
| EP | 3116035 A1 * | 1/2017 | .......... | H10F 77/703 |
| JP | 2005-101151 A | 4/2005 | | |
| JP | 2014-504003 A | 2/2014 | | |
| JP | 2017-529682 A | 10/2017 | | |
| JP | 2018050006 | 3/2018 | | |
| JP | 2021145056 | 9/2021 | | |
| WO | WO 2017043522 A1 | 3/2017 | | |
| WO | WO 2021010422 | 1/2021 | | |

OTHER PUBLICATIONS

Extended European Search Report in European Appln No. 22913105. 7, dated Mar. 20, 2025, 12 pages.
Office Action in Australian Appln. No. 2022425791, dated Mar. 25, 2025, 3 pages.

* cited by examiner

SOLAR CELL AND FABRICATION METHOD THEREOF

CROSS-REFERENCE TO RELATED APPLICATIONS

This application is a continuation-in-part of International Application No. PCT/CN2022/092291, filed on May 11, 2022, which claims priority to Chinese Patent Application No. 202111644240.1, filed on Dec. 29, 2021. The disclosures of the aforementioned applications are incorporated herein by reference in their entireties.

TECHNICAL FIELD

The present disclosure relates to the field of solar cell technologies, and in particular, to a solar cell and a fabrication method thereof.

BACKGROUND

At present, in existing solar cell structures, back-contact solar cells have higher photoelectric conversion efficiency since a front surface of each of the back-contact solar cells is not blocked by electrodes. P-type regions and N-type regions are arranged on different regions of a back surface of each of the back-contact solar cells, and a positive electrode and a negative electrode are then respectively arranged on each of the P-type regions and each of the N-type regions. In addition, this solar cell without blocking on the front surface is more aesthetically pleasing in addition to having high photoelectric conversion efficiency. Besides, it is easier to assemble an all-back electrode module. An interdigitated back contact (IBC) solar cell is one of existing technical directions for realizing highly efficient crystalline silicon solar cells.

However, a structure of the IBC solar cell is relatively complicated, and a fabrication method of the IBC solar cell is also relatively complicated with relatively high costs.

SUMMARY

For the foregoing problems, the present disclosure provides a solar cell and a fabrication method thereof. In some implementations, a P-type region of the solar cell includes two P-type doped layers instead of a single P-type doped layer, which can reduce the time and complexity of forming the P-type region. For example, a bottom P-type doped layer (e.g., the P-type doped layer closer to a substrate of the solar cell) can be formed using a slower deposition method, e.g., low pressure chemical vapor deposition (LPCVD) with lower temperature and lower gas flux rate, so that the crystallization rate of the formed semiconductor layer can be high. The bottom P-type doped layer can have good passivation effect, which can reduce parasite absorption of the solar cell, especially for double-sided solar cells, where P-type doped layer and the N-type doped layer are arranged on different sides of the solar cell. A top P-type doped layer (e.g., the P-type doped layer further away from the substrate of the solar cell) can be formed using a faster deposition method, e.g., LPCVD with higher temperature and higher gas flux rate, so that the top P-type doped layer can have a lower crystallization rate. As such, a solar cell having two P-type doped layers can be fabricated faster than a solar cell having a single P-type doped layer, while quality and efficiency of the solar cell are maintained or enhanced.

In some implementations, patterning needs to be performed only once to complete fabrication of doped semiconductors in two regions. In addition, doped regions fabricated by using this method have passivated contact structures at both electrodes, bringing a good passivation effect and greatly reducing a recombination rate in metal regions, thereby improving the efficiency of the solar cell.

The present disclosure provides a fabrication method of a solar cell, including:

providing a semiconductor substrate;

forming a first doped layer on a first surface of the semiconductor substrate;

patterning the first doped layer to retain a part of the first doped layer; and forming a third doped layer on a surface of a side of the first doped layer facing away from the semiconductor substrate through heating treatment, and forming a second doped layer on the first surface of the semiconductor substrate not covered by the first doped layer, where the first doped layer includes a first dopant and a second dopant;

the second doped layer includes the second dopant;

the third doped layer includes the first dopant and the second dopant;

a conductivity type of the first doped layer is opposite to a conductivity type of the second doped layer; and conductivity types of at least some regions in the third doped layer are the same as the conductivity type of the first doped layer.

Further, a first semiconductor layer is formed on the first surface of the semiconductor substrate, and the first dopant is diffused into the first semiconductor layer to form the first doped layer, or the first doped layer is formed on the first surface of the semiconductor substrate through in-situ doping; and a first auxiliary layer is formed on the surface of the side of the first doped layer facing away from the semiconductor substrate, and etching is then performed on a part of the first auxiliary layer and the first doped layer, to complete patterning and retain the part of the first doped layer.

Further, the second doped layer is formed, through in-situ doping, on the surface of the side of the first doped layer facing away from the semiconductor substrate and on the first surface of the semiconductor substrate not covered by the first doped layer; and heating treatment is performed on the second doped layer on the first doped layer, to diffuse the first dopant in the first doped layer into the second doped layer on the first doped layer, and the second dopant in the second doped layer is also diffused into the first doped layer, to transform the second doped layer on the first doped layer into the third doped layer.

Further, the heating treatment is laser treatment or heat treatment; and when the heating treatment is the laser treatment, in the third doped layer, a conductivity type of a region directly irradiated by laser is the same as the conductivity type of the first doped layer.

Further, in the third doped layer, the region whose conductivity type is the same as the conductivity type of the first doped layer extends through the third doped layer in a thickness direction.

Further, a second semiconductor layer is formed on the surface of the side of the first doped layer facing away from the semiconductor substrate and the first surface of the semiconductor substrate not covered by the first doped layer; and under the heating treatment, the second dopant is diffused into the second semiconductor layer, and due to a high temperature, the first dopant in the first doped layer is also diffused into the second semiconductor layer on the first doped layer, to transform the second semiconductor layer on the first doped layer into the third doped layer and transform the second semiconductor layer on the first surface of the semiconductor substrate into the second doped layer.

Further, in the third doped layer, conductivity types of at least some regions close to the first doped layer are the same as the conductivity type of the first doped layer.

Further, before the third doped layer is formed, in the first doped layer, a peak doping concentration of the first dopant ranges from $1\times10^{19}$ atoms/cm$^3$ to $5\times10^{21}$ atoms/cm$^3$.

Further, after the third doped layer is formed, in the first doped layer, a doping concentration of the first dopant is greater than a doping concentration of the second dopant; and in the at least some regions in the third doped layer, a doping concentration of the first dopant is greater than a doping concentration of the second dopant.

Further, in the first doped layer, a peak doping concentration of the first dopant ranges from $1\times10^{19}$ atoms/cm$^3$ to $3\times10^{21}$ atoms/cm$^3$;

in the second doped layer, a peak doping concentration of the second dopant ranges from $1\times10^{19}$ atoms/cm$^3$ to $3\times10^{19}$ atoms/cm$^3$; and in the at least some regions in the third doped layer, a peak doping concentration of the first dopant ranges from $1\times10^{20}$ atoms/cm$^3$ to $5\times10^{20}$ atoms/cm$^3$.

Further, a heating peak temperature of the heating treatment is 850° C. or higher, preferably 900° C. or higher, and more preferably 1000° C.; and a heating duration is 10 min or longer at the peak temperature.

Further, during formation of the third doped layer, due to the high temperature, the first dopant and the second dopant in the first doped layer and the third doped layer are diffused into the semiconductor substrate to form a third doped region; and/or the second dopant in the second doped layer is diffused into the semiconductor substrate to form a fourth doped region;

preferably, in the third doped region, a peak doping concentration of the first dopant ranges from $1\times10^{18}$ atoms/cm$^3$ to $3\times10^{21}$ atoms/cm$^3$, and a peak doping concentration of the second dopant ranges from $1\times10^{17}$ atoms/cm$^3$ to $3\times10^{19}$ atoms/cm$^3$; and preferably, in the fourth doped region, a peak doping concentration of the second dopant ranges from $1\times10^{18}$ atoms/cm$^3$ to $3\times10^{19}$ atoms/cm$^3$.

Further, the first dopant is a Group-VA element or a Group-IIIA element, and the second dopant is a Group-VA element or a Group-IIIA element; and preferably, the first dopant is a Group-VA element, and the second dopant is a Group-IIIA element.

Further, before the third doped layer is formed, the method further includes: performing etching on the first doped layer and the second doped layer located at a junction of the second doped layer and the first doped layer on the first surface of the semiconductor substrate, to expose the first surface of the semiconductor substrate and provide an isolation region between the first doped layer and the second doped layer.

Further, after the third doped layer is formed, the method further includes the following step: performing etching on the first doped layer, the second doped layer, and the third doped layer located at a junction of the second doped layer and the first doped layer on the first surface of the semiconductor substrate, to expose the first surface of the semiconductor substrate and provide an isolation region between the first doped layer and the second doped layer.

Further, each of the first doped layer, the second doped layer, and the third doped layer is one of a doped polysilicon layer, a doped microcrystalline silicon layer, or a doped amorphous silicon layer.

The present disclosure provides a solar cell, including a semiconductor substrate, where a first doped layer and a second doped layer are arranged on a first surface of the semiconductor substrate, and a third doped layer is arranged on a surface of a side of the first doped layer facing away from the semiconductor substrate, where a first doped layer and a second doped layer are arranged on a first surface of the semiconductor substrate, and a third doped layer is arranged on a surface of a side of the first doped layer facing away from the semiconductor substrate, where the first doped layer includes a first dopant and a second dopant;

the second doped layer includes the second dopant;

the third doped layer includes the first dopant and the second dopant;

conductivity types of at least some regions in the third doped layer are the same as a conductivity type of the first doped layer; and the conductivity type of the first doped layer is opposite to a conductivity type of the second doped layer.

Further, a thickness of the first doped layer ranges from 50 nm to 300 nm; and a thickness of the third doped layer and a thickness of the second doped layer are the same and are both less than or equal to 150 nm.

Further, when the thickness of the third doped layer is less than or equal to 30 nm, conductivity types of all regions in the third doped layer are the same as the conductivity type of the first doped layer.

Further, the thickness d of the third doped layer is greater than 30 nm and less than or equal to 150 nm, in the third doped layer, conductivity types of at least some regions close to the first doped layer are the same as the conductivity type of the first doped layer.

Further, the thickness of the third doped layer is greater than 30 nm and less than or equal to 150 nm, in the third doped layer, the regions whose conductivity types are the same as the conductivity type of the first doped layer run through the third doped layer in a thickness direction.

Further, in the first doped layer, a doping concentration of the first dopant first increases and then decreases and a doping concentration of the second dopant gradually decreases, both in a direction from a surface of a side away from the semiconductor substrate to a surface of a side close to the semiconductor substrate.

Further, in the second doped layer, a doping concentration of the second dopant remains consistent in a direction from a surface of a side away from the semiconductor substrate to a surface of a side close to the semiconductor substrate.

Further, in the third doped layer, a doping concentration of the first dopant gradually increases in a direction from a surface of a side away from the semiconductor substrate to a surface of a side close to the semiconductor substrate; and Further, the third doped layer not only covers the surface of the side of the first doped layer facing away from the semiconductor substrate, but also covers a side surface of the first doped layer close to the second doped layer, and the third doped layer covering the surface of the side of the first doped layer is in contact with the second doped layer.

Further, the solar cell further includes a first interface layer, where the first interface layer is located between the semiconductor substrate and the first doped layer; and/or
    a second interface layer, where the second interface layer extends from a surface of the first doped layer facing away from the first interface layer to a side surface of the first doped layer and continues to extend to cover a part of the semiconductor substrate not covered by the first doped layer, and each of the second doped layer and the third doped layer is arranged on a surface of a side of the second interface layer; and/or
    a back passivation layer, where the back passivation layer covers the third doped layer and the second doped layer.

Further, a width of the first doped layer is the same as a width of the third doped layer, and an isolation region is provided between the first doped layer and the second doped layer and between the third doped layer and the second doped layer.

Further, the solar cell further includes a first interface layer, where the first interface layer is located between the semiconductor substrate and the first doped layer; and/or
    a second interface layer, where the second interface layer is located between the first doped layer and the third doped layer and between the second doped layer and the semiconductor substrate; and/or
    a back passivation layer, where the back passivation layer covers the third doped layer, the isolation region, and the second doped layer.

Further, the solar cell further includes a first electrode and a second electrode, where the first electrode extends through the back passivation layer to form contact with the regions in the third doped layer whose conductivity type is the same as the conductivity type of the first doped layer; and the second electrode extends through the back passivation layer to form contact with the second doped layer.

Further, the solar cell is fabricated by using the method described above.

According to the present disclosure, in some implementations, a method of fabricating a solar cell includes performing patterning once only to complete fabrication of doped semiconductors in two regions. In some implementations, doped regions have passivated contact structures at both electrodes, bringing a good passivation effect and greatly reducing a recombination rate in metal regions, thereby improving the efficiency of the solar cell. In some implementations, high-temperature heat treatment needs to be performed once only in the back contact fabrication method, reducing thermal damage caused by the high-temperature heat treatment.

BRIEF DESCRIPTION OF THE DRAWINGS

The accompanying drawings are provided to better understand the present disclosure and do not constitute any inappropriate limitation to the present disclosure. In which:
FIGS. 3A-3L illustrate an example process of fabricating a solar cell, according to the present disclosure.

DESCRIPTIONS OF REFERENCE NUMERALS

1—semiconductor substrate, 2—first interface layer, 3—first doped layer, 4—second interface layer, 5—third doped layer, 6—second doped layer, 7—back passivation layer, 8—first electrode, 9—second electrode, 10—isolation region, 11—third doped region, 12—fourth doped region, 301—semiconductor substrate, 302a—first tunnel oxide layer, 302b—second tunnel oxide layer, 302c—third tunnel oxide layer, 303a—first semiconductor layer, 303b—second semiconductor layer, 303c—third semiconductor layer, 304a—first mask layer, 304b—second mask layer, 305—first doped region, 306—second doped region, 307—passivation layer, 308—first electrode, 309—second electrode, 351—first region, 352—second region, and 353—isolation region.

DETAILED DESCRIPTION

Exemplary embodiments of the present disclosure are described below, and various details of the embodiments of the present disclosure are included to facilitate understanding and should be considered exemplary only. Therefore, a person of ordinary skill in the art should be aware that various changes and modifications may be made to the embodiments described here without departing from the scope and spirit of the present disclosure. Similarly, for clarity and conciseness, descriptions of well-known functions and structures are omitted in the following description. In the present disclosure, upper and lower positions are determined according to an incident direction of light, and an incident point of the light is defined as an upper position.

Figure 1:
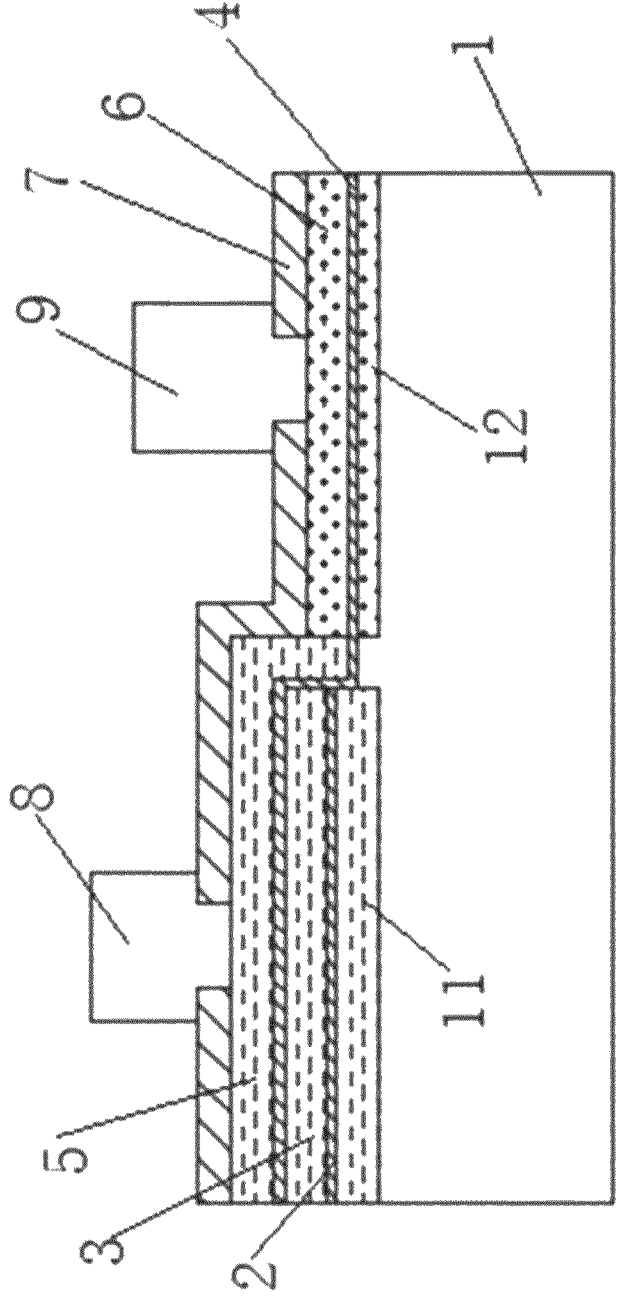
FIG. 1 is a schematic structural diagram of a solar cell according to the present disclosure.

The present disclosure provides two solar cells. Details are as follows:

As shown in FIG. 1, a first solar cell includes a semiconductor substrate 1, where a surface of a side of the semiconductor substrate 1 is divided into a first region and a second region. A first interface layer 2, a first doped layer 3, a second interface layer 4, and a third doped layer 5 are sequentially arranged on the surface of the side of the semiconductor substrate 1 in the first region. A second interface layer 4 and a second doped layer 6 are sequentially arranged on the surface of the same side of the semiconductor substrate 1 in the second region. The second interface layer 4 extends from a surface of a side of the first doped layer 3 to a side surface of the first doped layer and covers the semiconductor substrate 1 in the second region.

In some implementations, the third doped layer 5 not only covers the second interface layer 4 on a side of the first doped layer 3 facing away from the semiconductor substrate 1 but also covers a side surface of the first doped layer close to the second doped layer 6. The third doped layer 5 extending to the side surface is in contact with the second doped layer 6. As such, the third doped layer 5 arranged between the first doped layer 3 and the second doped layer 6 can be used as a soft breakdown path to provide anti-hot spot effect for the solar cell. A hot spot can refer to a high-temperate area in the solar cell, which may degrade performance or cause damage to the solar cell.

A back passivation layer 7 covering the third doped layer 5 and the second doped layer 6 is further arranged on a surface of a side of the third doped layer 5 facing away from the second interface layer 4, and a first electrode 8 extending through the back passivation layer 7 to form contact with the third doped layer 5 is further arranged on the back passivation layer 7 on the third doped layer 5. A conductivity type of the first doped layer 3 is opposite to a conductivity type of the second doped layer 6. Conductivity types of at least some regions in the third doped layer 5 are the same as the conductivity type of the first doped layer 3. In the third doped layer 5, a region whose conductivity type is the same as the conductivity type of the first doped layer 3 is a first conductivity type region, and a region whose conductivity type is the same as the conductivity type of the second doped layer is a second conductivity type region. The first electrode 8 is in contact with the first conductivity type region in the third doped layer 5 and the first electrode is electrically connected to the first doped layer 3 through the first conductivity type region, and a second electrode 9 extending through the back passivation layer 7 to form contact with the second doped layer 6 is further arranged on the back passivation layer 7 on the second doped layer 6.

The first electrode 8 and the second electrode 9 may be both made of a material including gold, silver, or aluminum.

The semiconductor substrate 1 may be a silicon substrate or a germanium substrate.

The semiconductor substrate 1 may be a P-type conductive semiconductor substrate or an N-type conductive semiconductor substrate.

In the present disclosure, the conductivity type may be obtained through testing by using an electrochemical capacitance-voltage (ECV) method or the like, or may be obtained through testing of a PN probe.

A doping concentration may be tested by using the ECV method.

Doping elements in the first doped layer, the second doped layer, the third doped region, and the fourth doped region may be characterized through scanning transmission electronic microscopy (STEM) or may be characterized through secondary ion mass spectrometry (SIMS).

In the present disclosure, the first interface layer 2 may be one or more of an oxide layer, a nitride layer, a carbide layer, or a hydrogenated amorphous silicon layer, where the oxide layer includes a mixture of one or more of silicon oxide, silicon oxynitride, aluminum oxide, titanium oxide, $HfO_2$, $Ga_2O_3$, $Ta_2O_5$, or $Nb_2O_5$, the nitride layer includes one or more of silicon nitride, aluminum nitride, TiN, or TiCN, the carbide layer includes SiC, SiCN, or the like. Specifically, the first interface layer 2 may be a tunneling oxide layer with a thickness ranging from 0.5 nm to 5 nm. For example, the thickness of the first interface layer may be 0.5 nm, 1 nm, 1.5 nm, 2 nm, 2.5 nm, 3 nm, 3.5 nm, 4 nm, 4.5 nm, or 5 nm.

In the present disclosure, the second interface layer 4 may be one or more of an oxide layer, a nitride layer, a carbide layer, or a hydrogenated amorphous silicon layer, where the oxide layer includes a mixture of one or more of silicon oxide, silicon oxynitride, aluminum oxide, titanium oxide, $HfO_2$, $Ga_2O_3$, $Ta_2O_5$, or $Nb_2O_5$, the nitride layer includes one or more of silicon nitride, aluminum nitride, TiN, or TiCN, and the carbide layer includes SiC, SiCN, or the like. Preferably, the second interface layer is silicon oxide with a thickness ranging from 0.5 nm to 5 nm. For example, the thickness of the second interface layer may be 0.5 nm, 1 nm, 1.5 nm, 2 nm, 2.5 nm, 3 nm, 3.5 nm, 4 nm, 4.5 nm, or 5 nm.

In the present disclosure, a front passivation layer and an anti-reflection layer are further sequentially arranged on a surface of a side of the semiconductor substrate 1 facing away from the first interface layer 2, where the front passivation layer may be made of one or more of silicon nitride, silicon oxide, silicon oxynitride, aluminum oxide, silicon carbide, or amorphous silicon.

In the present disclosure, the first doped layer 3 may be a doped amorphous silicon layer, a doped microcrystalline silicon layer, a doped polysilicon layer, nano-silicon, or a mixture of one or more of the foregoing materials, and preferably the doped amorphous silicon layer. A fabrication temperature of amorphous silicon is lower and independent annealing does not need to be performed on the amorphous silicon, so that annealing may be performed in various subsequent doping or heating processes, thereby consuming less process time compared with other materials. A thickness of the first doped layer 3 ranges 30 nm to 500 nm, preferably from 50 nm to 300 nm, and for example, may be 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, or 300 nm.

Specifically, the second doped layer 6 may be a doped amorphous silicon layer, a doped microcrystalline silicon layer, a doped polysilicon layer, nano-silicon, or a mixture of one or more of the foregoing materials, and preferably the doped amorphous silicon layer. A fabrication temperature of amorphous silicon is lower, so that less process time is consumed compared with other materials. A thickness of the second doped layer 6 is less than or equal to 150 nm, and for example, may be 15 nm, 20 nm, 30 nm, 40 nm, 50 nm, 60 nm, 70 nm, 80 nm, 90 nm, 100 nm, 110 nm, 120 nm, 130 nm, 140 nm, or 150 nm.

Specifically, the third doped layer 5 may be a doped amorphous silicon layer, a doped microcrystalline silicon layer, a doped polysilicon layer, nano-silicon, or a mixture of one or more of the foregoing materials. Preferably, the third doped layer 5 and the second doped layer 6 are made of the same material. A thickness of the third doped layer ranges from 10 nm to 300 nm, preferably 20 cm to 150 nm. In some implementations, a thickness of the third doped layer 5 is less than or equal to 150 nm. For example, the thickness of the third doped layer may be 15 nm, 20 nm, 30 nm, 40 nm, 50 nm, 60 nm, 70 nm, 80 nm, 90 nm, 100 nm, 110 nm, 120 nm, 130 nm, 140 nm, or 150 nm.

Specifically, the thickness of the third doped layer 5 is the same as the thickness of the second doped layer 6.

In the present disclosure, the first doped layer 3 includes a first dopant and a second dopant, and a peak doping concentration of the first dopant is greater than a peak doping concentration of the second dopant;

the second doped layer 6 includes the second dopant;

the third doped layer 5 includes the first dopant and the second dopant; and in the at least some regions in the third doped layer 5, a peak doping concentration of the first dopant is greater than a peak doping concentration of the second dopant, so that the conductivity types of the at least some regions in the third doped layer 5 are the same as the conductivity type of the first doped layer 3.

When the first doped layer 3 is a P-type doped layer, the second doped layer 6 is an N-type doped layer. On the contrary, when the first doped layer 3 is an N-type doped layer, the second doped layer 6 is a P-type doped layer. Using silicon as an example, a P-type conductive dopant is generally a Group-IIIA element such as gallium Ga or boron B; and an N-type dopant is generally a Group-VA element such as a phosphorus P element.

Specifically, in the first doped layer 3, the peak doping concentration of the first dopant ranges from $1 \times 10^{19}$ atoms/$cm^3$ to $3 \times 10^{21}$ atoms/$cm^3$, and for example, may be $1 \times 10^{19}$ atoms/cm$^3$, $2\times10^{19}$ atoms/cm$^3$, $3\times10^{19}$ atoms/cm$^3$, $4\times10^{19}$ atoms/cm$^3$, $5\times10^{19}$ atoms/cm$^3$, $6\times10^{19}$ atoms/cm$^3$, $7\times10^{19}$ atoms/cm$^3$, $8\times10^{19}$ atoms/cm$^3$, $9\times10^{19}$ atoms/cm$^3$, $1\times10^{20}$ atoms/cm$^3$, $2\times10^{20}$ atoms/cm$^3$, $3\times10^{20}$ atoms/cm$^3$, $4\times10^{20}$ atoms/cm$^3$, $5\times10^{20}$ atoms/cm$^3$, $6\times10^{20}$ atoms/cm$^3$, $7\times10^{20}$ atoms/cm$^3$, $8\times10^{20}$ atoms/cm$^3$, $9\times10^{20}$ atoms/cm$^3$, $1\times10^{21}$ atoms/cm$^3$, $2\times10^{21}$ atoms/cm$^3$, or $3\times10^{21}$ atoms/cm$^3$. In some implementations, the peak doping concentration of the first dopant ranges from $1\times10^{18}$ atoms/cm$^3$ to $3\times10^{21}$ atoms/cm$^3$.

In the second doped layer 6, a peak doping concentration of the second dopant ranges from $1\times10^{19}$ atoms/cm$^3$ to $3\times10^{19}$ atoms/cm$^3$, and for example, may be $1\times10^{19}$ atoms/cm$^3$, $2\times10^{19}$ atoms/cm$^3$, or $3\times10^{19}$ atoms/cm$^3$.

In the at least some regions in the third doped layer 5, the peak doping concentration of the first dopant ranges from $1\times10^{20}$ atoms/cm$^3$ to $5\times10^{20}$ atoms/cm$^3$, and for example, may be $1\times10^{20}$ atoms/cm$^3$, $2\times10^{20}$ atoms/cm$^3$, $3\times10^{20}$ atoms/cm$^3$, $4\times10^{20}$ atoms/cm$^3$, or $5\times10^{20}$ atoms/cm$^3$. In some implementations, in the at least some regions in the third doped layer 5, the peak doping concentration of the second dopant ranges from $1\times10^{17}$ atoms/cm$^3$ to $1\times10^{21}$ atoms/cm$^3$.

In the present disclosure, the first dopant is a Group-VA element or a Group-IIIA element, and preferably a Group-VA element; and the second dopant is a Group-VA element or a Group-IIIA element, and preferably a Group-IIIA element.

Specifically, the first dopant is phosphorus, gallium, or boron, and preferably phosphorus; and the second dopant is phosphorus, gallium, or boron, and preferably boron.

A dopant is a substance added through a doping source, and for example, when the doping source is POCl$_3$, the dopant is phosphorus.

Phosphorus-containing doping sources generally include: POCl$_3$ (generally used during heat diffusion), PH$_3$ (phosphine, which is used during ion implantation, in-situ doping, or the like), phosphorus-containing silicon oxide (doped through an APCVD method), or the like. Boron-containing doping sources generally include: BBr$_3$, BCl$_3$ (BBr$_3$ and BCl$_3$ are both used during heat diffusion), or B$_2$H$_6$ (diborane, which is generally used during in-situ doping or ion implantation).

In the present disclosure, in the first doped layer 3, a doping concentration of the first dopant first increases and then decreases and a doping concentration of the second dopant gradually decreases, both in a direction from a surface of a side away from the semiconductor substrate 1 to a surface of a side close to the semiconductor substrate 1.

In the second doped layer 6, a doping concentration of the second dopant remains consistent in a direction from a surface of a side away from the semiconductor substrate 1 to a surface of a side close to the semiconductor substrate 1.

In the third doped layer 5, a doping concentration of the first dopant gradually increases in a direction from a surface of a side away from the semiconductor substrate 1 to a surface of a side close to the semiconductor substrate 1; and a doping concentration of the second dopant remains consistent in the direction from the surface of the side away from the semiconductor substrate 1 to the surface of the side close to the semiconductor substrate 1.

Further, when the thickness of the third doped layer 5 is less than 30 nm, in the third doped layer 5, the doping concentration of the first dopant is greater than the doping concentration of the second dopant, and a conductivity type of the entire third doped layer 5 is the same as the conductivity type of the first doped layer 3. When the thickness of the third doped layer 5 ranges from 30 nm to 150 nm, the doping concentration of the first dopant is greater than the doping concentration of the second dopant in a part of the third doped layer, and a conductivity type of the part of the third doped layer 5 is the same as the conductivity type of the first doped layer 3; and the doping concentration of the first dopant is less than the doping concentration of the second dopant in another part of the third doped layer, and a conductivity type of the another part of the third doped layer is opposite to the conductivity type of the first doped layer 3.

Specifically, when the thickness of the third doped layer 5 ranges from 30 nm to 150 nm, in the third doped layer 5, conductivity types of at least some regions close to the first doped layer 3 are the same as the conductivity type of the first doped layer 3, and the first electrode extends through the back passivation layer 7 to enter the third doped layer and form contact with the region having the first conductivity type.

Specifically, when the thickness of the third doped layer 5 is greater than 30 nm and less than or equal to 150 nm, in the third doped layer 5, the regions whose conductivity type is the same as the conductivity type of the first doped layer 3 run through the third doped layer 5 in a thickness direction, and the first electrode extends through the back passivation layer to come in direct contact with the regions of the third doped layer having the first conductivity type.

In the present disclosure, on a side of the semiconductor substrate 1 close to the first doped layer 3, the first dopant or the first dopant and the second dopant pass through the first interface layer 2 to enter the semiconductor substrate 1 to form a third doped region 11. That is, the third doped region 11 includes the first dopant or the first dopant and the second dopant.

On a side of the semiconductor substrate 1 close to the second doped layer 6, the second dopant passed through the second interface layer 4 to enter the semiconductor substrate 1 to form a fourth doped region 12. That is, the fourth doped region 12 includes the second dopant.

In a specific implementation, the semiconductor substrate 1 only includes the third doped region 11.

In a specific implementation, the semiconductor substrate 1 only includes the fourth doped region 12.

In a specific implementation, the semiconductor substrate 1 includes both the third doped region 11 and the fourth doped region 12.

A fabrication method of the first solar cell includes the following steps:

Step 1: Provide a semiconductor substrate 1.

Step 2: Form a first doped layer 3 on a first surface of the semiconductor substrate 1.

Step 3: Pattern the first doped layer 3 to retain a part of the first doped layer 3.

Step 4: Form a third doped layer 5 on a surface of a side of the first doped layer 3 facing away from the semiconductor substrate 1 through heating treatment, and form a second doped layer 6 on the first surface of the semiconductor substrate 1 not covered by the first doped layer 3.

The first doped layer 3 includes a first dopant and a second dopant;

the second doped layer 6 includes the second dopant;

the third doped layer 5 includes the first dopant and the second dopant;

a conductivity type of the first doped layer 3 is opposite to a conductivity type of the second doped layer 6; and conductivity types of at least some regions in the third doped layer 5 are the same as the conductivity type of the first doped layer 3.

In Step 2, a first interface layer 2 is formed on a surface of a side of the semiconductor substrate 1 through a low pressure chemical vapor deposition (LPCVD) method at a temperature ranging from 400° C. to 700° C., and the first doped layer 3 is formed on a surface of a side of the first interface layer 2 facing away from the semiconductor substrate 1 through in-situ doping and the LPCVD method.

Alternatively, in Step 2, a first interface layer 2 is formed on a surface of a side of the semiconductor substrate 1 through an LPCVD method at a temperature ranging from 400° C. to 700° C., a first semiconductor layer is formed on a surface of a side of the first interface layer 2 facing away from the semiconductor substrate 1, and the first dopant is doped into the first semiconductor layer through diffusion to form the first doped layer 3.

The first semiconductor layer may be a polysilicon layer, a microcrystalline silicon layer, or an amorphous silicon layer.

In the first doped layer 3, a peak doping concentration of the first dopant ranges from $1 \times 10^{19}$ atoms/cm$^3$ to $5 \times 10^{21}$ atoms/cm$^3$.

In Step 3, a first auxiliary layer is formed on the surface of the side of the first doped layer 3 facing away from the semiconductor substrate 1, and etching is then performed on the first auxiliary layer and the first doped layer 3 on the second region, to complete patterning and retain the first doped layer 3 in the first region only.

Specifically, the first auxiliary layer may be a dielectric film such as silicon oxide, silicon nitride, or the like. Preferably, a silicon oxide film formed in the foregoing phosphorus doping may be used as the first auxiliary layer. The first auxiliary layer is then patterned. For example, a pattern may be printed by using an etching slurry to remove the first auxiliary layer, the first doped layer 3, and the first interface layer 2 that are outside the first region, or short-pulse laser may be used to remove the first auxiliary layer, the first doped layer 3, and the first interface layer 2 that are outside the first region.

In a preferred solution, an alkali solution is used to remove the first doped layer 3 and the first interface layer 2 that are outside the first region, and the alkali solution is also used to form a textured structure on a surface of the semiconductor substrate 1 in the second region. By using the alkali solution, the first doped layer 3 in the first region is patterned, and a textured surface in the second region is also fabricated. In this way, an IBC fabrication procedure is greatly simplified, and a current commonly used single-surface texturing process may be omitted.

In the related art, there are two methods for implementing single-surface texturing: A first method is to first polish both surfaces of a silicon wafer, fabricate a first auxiliary layer on a single surface, then perform texturing on the single surface, and remove the first auxiliary layer after texturing.

A second method is to first polish both surfaces of a silicon wafer, fabricate a first auxiliary layer on a single surface, then polish the single surface, and remove the first auxiliary layer.

The existing two single-surface texturing methods are both complicated, and a single-surface texturing process needs to be completed from the very beginning of a solar cell fabrication process. The single-surface texturing process needs to be completed through at least four procedures. In addition, the textured surface may be damaged in a subsequent normal solar cell fabrication process, reducing an anti-reflection effect of the textured surface of the solar cell.

In Step 4, before the second doped layer and the third doped layer are formed, a second interface layer 4 may be first formed, where the second interface layer 4 not only covers the surface of the side of the first doped layer facing away from the semiconductor substrate and a side surface, but also covers the first surface of the semiconductor substrate not covered by the first doped layer.

In a specific implementation, the second doped layer 6 is formed on a surface of a side of the second interface layer 4 facing away from the semiconductor substrate 1 and the first doped layer 3 through in-situ doping and the LPCVD method, where the in-situ doping refers to that deposition and doping of amorphous silicon are completed simultaneously. Heating treatment is then performed on the second doped layer 6 on the first doped layer 3, to diffuse the first dopant in the first doped layer 3 into the second doped layer 6 on the first doped layer, and the second dopant in the second doped layer 6 on the first doped layer is also diffused into the first doped layer 3, to transform the second doped layer 6 on the first doped layer 3 into the third doped layer 5. The second doped layer 6 on the first surface not covered by the first doped layer 3 is still the second doped layer 6.

Specifically, the heating treatment is laser treatment or heat treatment. When the laser treatment is performed, in the third doped layer 5, a region directly irradiated by laser is a first conductivity type region (the region having the first conductivity type extends through the third doped layer 5 in a thickness direction), a conductivity type of the region having the first conductivity type is the same as the conductivity type of the first doped layer 3, and a doping concentration of the first dopant in the region having the first conductivity type is greater than a doping concentration of the second dopant in the region having the first conductivity type.

Power of the laser treatment is greater than 5 W, and preferably ranges from 5 W to 30 W, bringing a better heating effect. A wavelength of the laser treatment is longer than 500 nm. For example, a green light laser emitter whose wavelength is 532 nm may be used for the laser treatment; a yellow light laser emitter whose wavelength is 589 nm may be used for the laser treatment; a red light laser emitter whose wavelength is 635 nm, 660 nm, 670 nm, or 671 nm may be used for the laser treatment; or infrared laser whose wavelength is 808 nm, 914 nm, 946 nm, 980 nm, 1047 nm, 1053 nm, 1064 nm, 1320 nm, or 1342 nm may be used for the laser treatment.

In another specific implementation, a second semiconductor layer is formed on a surface of a side of the second interface layer 4 facing away from the semiconductor substrate 1 and the first doped layer 3, under the heating treatment, the second dopant is diffused into the second semiconductor layer, and due to a high temperature, the first dopant in the first doped layer 3 is also diffused into the second semiconductor layer on the first doped layer, to transform the second semiconductor layer on the first doped layer 3 into the third doped layer 5 and transform the second semiconductor layer on the first surface of the semiconductor substrate 1 into the second doped layer 6.

Specifically, in the third doped layer 5, conductivity types of at least some regions close to the first doped layer 3 are the same as the conductivity type of the first doped layer 3.

In the first doped layer 3, a peak doping concentration of the first dopant ranges from $1 \times 10^{19}$ atoms/cm$^3$ to $3 \times 10^{21}$ atoms/cm$^3$, and a peak doping concentration of the second dopant ranges from $1 \times 10^{19}$ atoms/cm$^3$ to $3 \times 10^{19}$ atoms/cm$^3$.

13

In the at least some regions in the third doped layer 5, a peak doping concentration of the first dopant ranges from $1\times10^{20}$ atoms/cm$^3$ to $5\times10^{20}$ atoms/cm$^3$, and a peak doping concentration of the second dopant ranges from $1\times10^{19}$ atoms/cm$^3$ to $3\times10^{19}$ atoms/cm$^3$.

In the second doped layer 6, a peak doping concentration of the second dopant ranges from $1\times10^{19}$ atoms/cm$^3$ to $3\times10^{19}$ atoms/cm$^3$.

Specifically, a heating peak temperature of the heating treatment is 850° C. or higher, preferably 900° C. or higher, and more preferably 1000° C. For example, the heating peak temperature is 850° C., 900° C., 1000° C., 1100° C., 1200° C., or the like. At the peak temperature, a heating duration is 10 min or longer, and preferably, 30 min or longer. For example, the heating duration may be 10 min, 20 min, 30 min, 40 min, 50 min, 60 min, or the like.

The second semiconductor layer may be a polysilicon layer, a microcrystalline silicon layer, or an amorphous silicon layer. The peak temperature of the heating treatment is relatively high, so that amorphous silicon or microcrystalline silicon in the second semiconductor layer may be transformed into polysilicon, thereby improving the electrical conductivity of the second semiconductor layer.

Optionally, after the heating treatment, it may be set to remove an oxide film that may be formed during a heating process, and a solution used for removing the oxide film includes fluorine. Specifically, a solution including HF, NH$_4$F, or the like may be used to remove the oxide film.

The method further includes the following steps:

Step 5: Form a back passivation layer 7 on the third doped layer 5 and a surface of a side of the second doped layer 6 facing away from the second interface layer 4, and form a front passivation layer on a surface of a side of the semiconductor substrate 1 facing away from the first interface layer 2 simultaneously.

Step 6: Form a first electrode 8 extending through the back passivation layer 7 on the third doped layer 5, and form a second electrode 9 extending through the back passivation layer 7 on the second doped layer 6.

Specifically, there are a plurality of methods for forming the electrodes. For example, a fire-through paste may be directly coated on the back passivation layer 7, the electrode paste then extends through the back passivation layer 7 through heat treatment to form contact with the third doped layer 5 and the second doped layer 6. Alternatively, holes may be provided on the back passivation layer 7 first, and the electrodes are then formed by using methods such as an electrode paste, a laser transfer printing method, electroplating, chemical plating, light induced plating, or the like, or by using physical vapor deposition methods such as evaporation, sputtering, or the like. Apparently, the electrodes may be formed through a combination of one or more of the foregoing methods.

A fabrication method of the first solar cell includes the following steps:

Step 1: Provide a semiconductor substrate 1.

Step 2: Form a first doped layer 3 on a first surface of the semiconductor substrate 1.

Specifically, a first interface layer 2 is formed on a surface of a side of the semiconductor substrate 1 through a low pressure chemical vapor deposition (LPCVD) method at a temperature ranging from 400° C. to 700° C., and the first doped layer 3 is formed on a surface of a side of the first interface layer 2 facing away from the semiconductor substrate 1 through in-situ doping and the LPCVD method.

Alternatively, in Step 2, a first interface layer 2 is formed on a surface of a side of the semiconductor substrate 1 through an LPCVD method at a temperature ranging from 400° C. to 700° C., a first semiconductor layer is formed on a surface of a side of the first interface layer 2 facing away from the semiconductor substrate 1, and a first dopant is doped into the first semiconductor layer through diffusion to form the first doped layer 3.

The first semiconductor layer may be a polysilicon layer, a microcrystalline silicon layer, or an amorphous silicon layer.

In the first doped layer 3, a peak doping concentration of the first dopant ranges from $1\times10^{19}$ atoms/cm$^3$ to $5\times10^{21}$ atoms/cm$^3$.

Step 3: Pattern the first doped layer 3 to retain a part of the first doped layer 3.

Specifically, a first auxiliary layer is formed on a surface of a side of the first doped layer 3 facing away from the semiconductor substrate 1, and etching is then performed on the first auxiliary layer and the first doped layer 3 on the second region, to complete patterning and retain the first doped layer 3 in the first region only.

Specifically, the first auxiliary layer may be a dielectric film such as silicon oxide, silicon nitride, or the like. Preferably, a silicon oxide film formed in the foregoing phosphorus doping may be used as the first auxiliary layer. The first auxiliary layer is then patterned. For example, a pattern may be printed by using an etching slurry to remove the first auxiliary layer, the first doped layer 3, and the first interface layer 2 that are outside the first region, or short-pulse laser may be used to remove the first auxiliary layer, the first doped layer 3, and the first interface layer 2 that are outside the first region.

In a preferred solution, an alkali solution is used to remove the first doped layer 3 and the first interface layer 2 that are outside the first region, and the alkali solution is also used to form a textured structure on a surface of the semiconductor substrate 1 in the second region. By using the alkali solution, the first doped layer 3 in the first region is patterned, and a textured surface in the second region is also fabricated. In this way, an IBC fabrication procedure is greatly simplified, and a current commonly used single-surface texturing process may be omitted.

In the related art, there are two methods for implementing single-surface texturing: A first method is to first polish both surfaces of a silicon wafer, fabricate a first auxiliary layer on a single surface, then perform texturing on the single surface, and remove the first auxiliary layer after texturing.

A second method is to first polish both surfaces of a silicon wafer, fabricate a first auxiliary layer on a single surface, then polish the single surface, and remove the first auxiliary layer.

The existing two single-surface texturing methods are both complicated, and a single-surface texturing process needs to be completed from the very beginning of a solar cell fabrication process. The single-surface texturing process needs to be completed through at least four procedures. In addition, the textured surface may be damaged in a subsequent normal solar cell fabrication process, reducing an anti-reflection effect of the textured surface of the solar cell.

Step 4: Form a third doped layer 5 on a surface of a side of the first doped layer 3 facing away from the semiconductor substrate 1 through heating treatment, and forming a second doped layer 6 on the first surface of the semiconductor substrate 1 not covered by the first doped layer 3.

The first doped layer 3 includes a first dopant and a second dopant;

the second doped layer 6 includes the second dopant;

the third doped layer 5 includes the first dopant and the second dopant;

a conductivity type of the first doped layer 3 is opposite to a conductivity type of the second doped layer 6; and conductivity types of at least some regions in the third doped layer 5 are the same as the conductivity type of the first doped layer 3.

Specifically, before the second doped layer and the third doped layer are formed, a second interface layer 4 may be first formed, where the second interface layer 4 not only covers the surface of the side of the first doped layer facing away from the semiconductor substrate and a side surface, but also covers the first surface of the semiconductor substrate not covered by the first doped layer.

In a specific implementation, the second doped layer 6 is formed on a surface of a side of the second interface layer 4 facing away from the semiconductor substrate 1 and the first doped layer 3 through in-situ doping and the LPCVD method. Heating treatment is then performed on the second doped layer 6 on the first doped layer 3, to diffuse the first dopant in the first doped layer 3 into the second doped layer 6 on the first doped layer, and the second dopant in the second doped layer 6 on the first doped layer is also diffused into the first doped layer 3, to transform the second doped layer 6 on the first doped layer 3 into the third doped layer 5. The second doped layer 6 on the first surface not covered by the first doped layer 3 is still the second doped layer 6.

Specifically, the heating treatment is laser treatment or heat treatment. When the laser treatment is performed, in the third doped layer 5, a region directly irradiated by laser is a region having the first conductivity type (the region having the first conductivity type extends through the third doped layer 5 in a thickness direction), a conductivity type of the region having the first conductivity type is the same as the conductivity type of the first doped layer 3, and a doping concentration of the first dopant in the region having the first conductivity type is greater than a doping concentration of the second dopant in the region having the first conductivity type. Power of the laser treatment is greater than 5 W, and preferably ranges from 5 W to 30 W, bringing a better heating effect. A wavelength of the laser treatment is longer than 500 nm. For example, a green light laser emitter whose wavelength is 532 nm may be used for the laser treatment; a yellow light laser emitter whose wavelength is 589 nm may be used for the laser treatment; a red light laser emitter whose wavelength is 635 nm, 660 nm, 670 nm, or 671 nm may be used for the laser treatment; or infrared laser whose wavelength is 808 nm, 914 nm, 946 nm, 980 nm, 1047 nm, 1053 nm, 1064 nm, 1320 nm, or 1342 nm may be used for the laser treatment.

In another specific implementation, a second semiconductor layer is formed on a surface of a side of the second interface layer 4 facing away from the semiconductor substrate 1 and the first doped layer 3, under the heating treatment, the second dopant is diffused into the second semiconductor layer, and due to a high temperature, the first dopant in the first doped layer 3 is also diffused into the second semiconductor layer on the first doped layer, to transform the second semiconductor layer on the first doped layer 3 into the third doped layer 5 and transform the second semiconductor layer on the first surface of the semiconductor substrate 1 into the second doped layer 6.

Specifically, in the third doped layer 5, conductivity types of at least some regions close to the first doped layer 3 are the same as the conductivity type of the first doped layer 3.

In the first doped layer 3, a peak doping concentration of the first dopant ranges from $1\times10^{19}$ atoms/cm$^3$ to $3\times10^{21}$ atoms/cm$^3$, and a peak doping concentration of the second dopant ranges from $1\times10^{19}$ atoms/cm$^3$ to $3\times10^{19}$ atoms/cm$^3$.

In the at least some regions in the third doped layer 5, a peak doping concentration of the first dopant ranges from $1\times10^{20}$ atoms/cm$^3$ to $5\times10^{20}$ atoms/cm$^3$, and a peak doping concentration of the second dopant ranges from $1\times10^{19}$ atoms/cm$^3$ to $3\times10^{19}$ atoms/cm$^3$.

In the second doped layer 6, a peak doping concentration of the second dopant ranges from $1\times10^{19}$ atoms/cm$^3$ to $3\times10^{19}$ atoms/cm$^3$.

Specifically, a heating peak temperature of the heating treatment or under a heating condition is 850° C. or higher, preferably 900° C. or higher, and more preferably 1000° C. For example, the heating peak temperature is 850° C., 900° C., 1000° C., 1100° C., 1200° C., or the like. At the peak temperature, a heating duration is 10 min or longer, and preferably, 30 min or longer. For example, the heating duration may be 10 min, 20 min, 30 min, 40 min, 50 min, 60 min, or the like.

The second semiconductor layer may be a polysilicon layer, a microcrystalline silicon layer, or an amorphous silicon layer. The peak temperature of the heating treatment is relatively high, so that amorphous silicon or microcrystalline silicon in the second semiconductor layer may be transformed into polysilicon, thereby improving the electrical conductivity of the second semiconductor layer.

Optionally, after the heating treatment, it may be set to remove an oxide film that may be formed during a heating process, and a solution used for removing the oxide film includes fluorine. Specifically, a solution including HF, NH$_4$F, or the like may be used to remove the oxide film.

Step 5: Form a back passivation layer 7 on the third doped layer 5 and a surface of a side of the second doped layer 6 facing away from the second interface layer 4, and form a front passivation layer on a surface of a side of the semiconductor substrate 1 facing away from the first interface layer 2 simultaneously.

Step 6: Form a first electrode 8 extending through the back passivation layer 7 on the third doped layer 5, and form a second electrode 9 extending through the back passivation layer 7 on the second doped layer 6.

Specifically, there are a plurality of methods for forming the electrodes. For example, a fire-through paste may be directly coated on the back passivation layer 7, the electrode paste then extends through the back passivation layer 7 through heat treatment to form contact with the third doped layer 5 and the second doped layer 6. Alternatively, holes may be provided on the back passivation layer 7 first, and the electrodes are then formed by using methods such as an electrode paste, a laser transfer printing method, electroplating, chemical plating, light induced plating, or the like, or by using physical vapor deposition methods such as evaporation, sputtering, or the like. Apparently, the electrodes may be formed through a combination of one or more of the foregoing methods.

Figure 2:
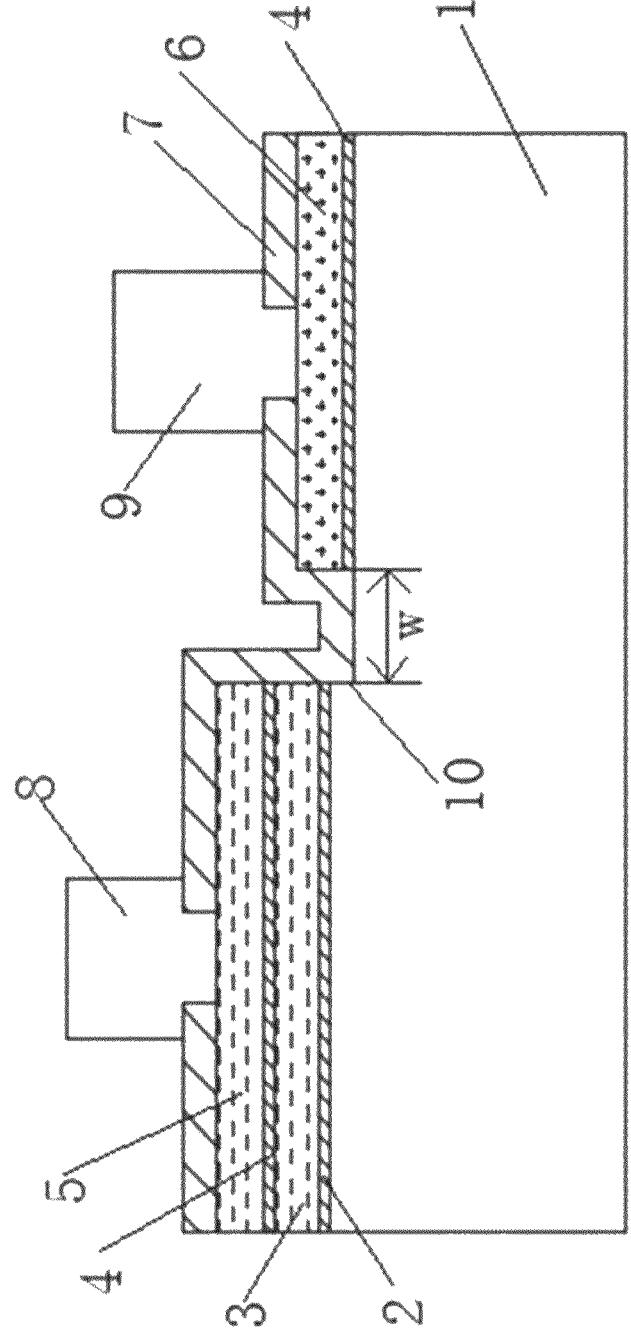
FIG. 2 is a schematic structural diagram of a solar cell according to the present disclosure.

As shown in FIG. 2, a second solar cell includes a semiconductor substrate 1, where a surface of a side of the semiconductor substrate 1 is divided into a first region and a second region that have a gap therebetween, a first interface layer 2, a first doped layer 3, a second interface layer 4, and a third doped layer 5 are sequentially arranged on the surface of the side of the semiconductor substrate 1 in the first region, and a second interface layer 4 and a second doped layer 6 are sequentially arranged on the surface of the same side of the semiconductor substrate 1 in the second region. A groove is formed on the third doped layer 5, the second interface layer 4, the first doped layer 3, a side surface of the first interface layer 2 close to the second doped layer 6, a surface of the semiconductor substrate 1 not covered by the first doped layer 3 and the second doped layer 6, the second interface layer 4, and a side surface of the second doped layer 6 close to the first doped layer 3, where the groove is an isolation region 10. A back passivation layer 7 covering the third doped layer 5, the isolation region 10, and the second doped layer 6 is further arranged on a surface of a side of the third doped layer 5 facing away from the second interface layer 4. A first electrode 8 extending through the back passivation layer 7 to form contact with the third doped layer 5 is further arranged on the back passivation layer 7 on the third doped layer 5, and a second electrode 9 extending through the back passivation layer 7 to form contact with the second doped layer 6 is further arranged on the back passivation layer 7 on the second doped layer 6.

A difference between the second solar cell and the first solar cell only lies in that, the isolation region 10 exists between the first region and the second region in the second solar cell, and only the back passivation layer 7 exists in the isolation region 10 (the third doped layer 5 is not in contact with the second doped layer 6). Therefore, for the semiconductor substrate 1, the first interface layer 2, the second interface layer 4, the first doped layer 3, the second doped layer 6, the third doped layer 5, the back passivation layer 7, the first electrode 8, and the second electrode 9 in the second solar cell, reference may all be made to those in the first solar cell.

A depth h of the isolation region 10 ranges from 300 nm to 1 μm, and for example, may be 300 nm, 400 nm, 500 nm, 600 nm, 700 nm, 800 nm, 900 nm, or 1 μm. A width w of the isolation region 10 ranges from 10 μm to 200 μm, and preferably ranges from 30 μm to 100 μm. For example, the width w of the isolation region may be 10 μm, 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, or 200 μm.

The back passivation layer 7 located at the isolation region 10 is conformal with the isolation region 10.

The isolation region 10 is configured to isolate P-type semiconductor regions from N-type semiconductor regions to prevent current leakage and also prevent occurrence of phenomena such as heat generation caused by breakdown of a lateral PN junction. In the solution of the present disclosure, both P-type doping and N-type doping exist in the first doped region, so that existence of the isolation region 10 becomes more important.

Thicknesses of the back passivation layer 7 on the third doped layer 5, the isolation region 10, and the second doped layer 6 are the same.

A fabrication method of the second solar cell includes the following steps:

Step 1: Provide a semiconductor substrate 1.

Step 2: Form a first doped layer 3 on a surface of a side of the semiconductor substrate 1.

Step 3: Pattern the first doped layer 3 to retain a part of the first doped layer 3.

Step 4: Form a third doped layer 5 on a surface of a side of the first doped layer 3 facing away from the semiconductor substrate 1 through heating treatment, and form a second doped layer 6 on a first surface of the semiconductor substrate 1 not covered by the first doped layer 3.

Step 5: Form a second auxiliary layer on the third doped layer 5 and a surface of a side of the second doped layer 6 facing away from a second interface layer 4 respectively, where the second auxiliary layer does not cover a position close to a junction of the third doped layer 5 and the second doped layer 6.

Step 6: Perform etching on the third doped layer 5 and the second doped layer 6 not covered by the second auxiliary layer, to expose the semiconductor substrate 1 (the exposed semiconductor substrate 1 is referred to as an isolation region 10), where an isolation region 10 is formed on the third doped layer 5, the second interface layer 4, the first doped layer 3, a side surface of a first interface layer 2 close to the isolation region 10, a surface of the semiconductor substrate 1 close to the isolation region 10, the second interface layer 4, and a side surface of the second doped layer 6 close to the isolation region 10.

The first doped layer 3 includes a first dopant and a second dopant;

the second doped layer 6 includes the second dopant;

the third doped layer 5 includes the first dopant and the second dopant;

a conductivity type of the first doped layer 3 is opposite to a conductivity type of the second doped layer 6; and conductivity types of at least some regions in the third doped layer 5 are the same as the conductivity type of the first doped layer.

In Step 2, a first interface layer 2 is formed on the surface of the side of the semiconductor substrate 1 through a low pressure chemical vapor deposition (LPCVD) method at a temperature ranging from 400° C. to 700° C.

In a specific implementation, the first doped layer 3 is formed on a surface of a side of the first interface layer 2 facing away from the semiconductor substrate 1 through in-situ doping and the LPCVD method.

In another specific implementation, a first semiconductor layer is formed on a surface of a side of the first interface layer 2 facing away from the semiconductor substrate 1, and the first dopant is doped into the first semiconductor layer to form the first doped layer 3.

The first semiconductor layer may be a polysilicon layer, a microcrystalline silicon layer, or an amorphous silicon layer.

In the first doped layer 3, a peak doping concentration of the first dopant ranges from $1 \times 10^{19}$ atoms/cm$^3$ to $5 \times 10^{21}$ atoms/cm$^3$.

In Step 3, a first auxiliary layer is formed on the surface of the side of the first doped layer 3 facing away from the semiconductor substrate 1, and etching is then performed on the first auxiliary layer and the first doped layer 3 on the second region, to complete patterning and retain the first doped layer 3 in the first region only.

Specifically, the first auxiliary layer may be a dielectric film such as silicon oxide, silicon nitride, or the like. Preferably, a silicon oxide film formed in the foregoing phosphorus doping may be used as the first auxiliary layer. The first auxiliary layer is then patterned. For example, a pattern may be printed by using an etching slurry to remove the first auxiliary layer, the first doped layer 3, and the first interface layer 2 that are outside the first region, or short-pulse laser may be used to remove the first auxiliary layer, the first doped layer 3, and the first interface layer 2 that are outside the first region.

In a preferred solution, an alkali solution is used to remove the first doped layer 3 and the first interface layer 2 that are outside the first region, and the alkali solution is also used to form a textured structure on a surface of the semiconductor substrate 1 in the second region. By using the alkali solution, the first doped layer 3 in the first region is patterned, and a textured surface in the second region is also fabricated. In this way, an IBC fabrication procedure is greatly simplified, and a current commonly used single-surface texturing process may be omitted.

In the related art, there are two methods for implementing single-surface texturing: A first method is to first polish both surfaces of a silicon wafer, fabricate a first auxiliary layer on a single surface, then perform texturing on the single surface, and remove the first auxiliary layer after texturing.

A second method is to first polish both surfaces of a silicon wafer, fabricate a first auxiliary layer on a single surface, then polish the single surface, and remove the first auxiliary layer.

The existing two single-surface texturing methods are both complicated, and a single-surface texturing process needs to be completed from the very beginning of a solar cell fabrication process. The single-surface texturing process needs to be completed through at least four procedures. In addition, the textured surface may be damaged in a subsequent normal solar cell fabrication process, reducing an anti-reflection effect of the textured surface of the solar cell.

In Step 4, before the second doped layer and the third doped layer are formed, a second interface layer 4 may be first formed, where the second interface layer 4 not only covers the surface of the side of the first doped layer facing away from the semiconductor substrate and a side surface, but also covers the first surface of the semiconductor substrate not covered by the first doped layer.

In a specific implementation, the second doped layer 6 is formed on a surface of a side of the second interface layer 4 facing away from the semiconductor substrate 1 and the first doped layer 3 through in-situ doping and the LPCVD method, where the in-situ doping refers to that deposition and doping of amorphous silicon are completed simultaneously. Heating treatment is then performed on the second doped layer 6 on the first doped layer 3, to diffuse the first dopant in the first doped layer 3 into the second doped layer 6 on the first doped layer, and the second dopant in the second doped layer 6 on the first doped layer is also diffused into the first doped layer 3, to transform the second doped layer 6 on the first doped layer 3 into the third doped layer 5. The second doped layer 6 on the first surface not covered by the first doped layer 3 is still the second doped layer 6.

Specifically, the heating treatment is laser treatment or heat treatment. When the laser treatment is performed, in the third doped layer 5, a region directly irradiated by laser is a region having the first conductivity type (the region having the first conductivity type extends through the third doped layer 5 in a thickness direction), a conductivity type of the region having the first conductivity type is the same as the conductivity type of the first doped layer 3, and a doping concentration of the first dopant in the region having the first conductivity type is greater than a doping concentration of the second dopant in the region having the first conductivity type. Power of the laser treatment is greater than 5 W, and preferably ranges from 5 W to 30 W, bringing a better heating effect. A wavelength of the laser treatment is longer than 500 nm. For example, a green light laser emitter whose wavelength is 532 nm may be used for the laser treatment; a yellow light laser emitter whose wavelength is 589 nm may be used for the laser treatment; a red light laser emitter whose wavelength is 635 nm, 660 nm, 660 nm, 670 nm, or 671 nm may be used for the laser treatment; or infrared laser whose wavelength is 808 nm, 914 nm, 946 nm, 980 nm, 1047 nm, 1053 nm, 1064 nm, 1320 nm, or 1342 nm may be used for the laser treatment.

In another specific implementation, a second semiconductor layer is formed on a surface of a side of the second interface layer 4 facing away from the semiconductor substrate 1 and the first doped layer 3, under the heating treatment, the second dopant is diffused into the second semiconductor layer, and due to a high temperature, the first dopant in the first doped layer 3 is also diffused into the second semiconductor layer on the first doped layer, to transform the second semiconductor layer on the first doped layer 3 into the third doped layer 5 and transform the second semiconductor layer on the first surface of the semiconductor substrate 1 into the second doped layer 6.

Specifically, in the third doped layer 5, conductivity types of at least some regions close to the first doped layer 3 are the same as the conductivity type of the first doped layer 3.

In the first doped layer 3, a peak doping concentration of the first dopant ranges from $1\times10^{19}$ atoms/cm³ to $3\times10^{21}$ atoms/cm³, and a peak doping concentration of the second dopant ranges from $1\times10^{19}$ atoms/cm³ to $3\times10^{19}$ atoms/cm³.

In the at least some regions in the third doped layer 5, a peak doping concentration of the first dopant ranges from $1\times10^{20}$ atoms/cm³ to $5\times10^{20}$ atoms/cm³, and a peak doping concentration of the second dopant ranges from $1\times10^{19}$ atoms/cm³ to $3\times10^{19}$ atoms/cm³.

In the second doped layer 6, a peak doping concentration of the second dopant ranges from $1\times10^{19}$ atoms/cm³ to $3\times10^{19}$ atoms/cm³.

Specifically, a heating peak temperature of the heating treatment or under a heating condition is 850° C. or higher, preferably 900° C. or higher, and more preferably 1000° C. For example, the heating peak temperature is 850° C., 900° C., 1000° C., 1100° C., 1200° C., or the like. At the peak temperature, a heating duration is 10 min or longer, and preferably, 30 min or longer. For example, the heating duration may be 10 min, 20 min, 30 min, 40 min, 50 min, 60 min, or the like.

The second semiconductor layer may be a polysilicon layer, a microcrystalline silicon layer, or an amorphous silicon layer. The peak temperature of the heating treatment is relatively high, so that amorphous silicon or microcrystalline silicon in the second semiconductor layer may be transformed into polysilicon, thereby improving the electrical conductivity of the second semiconductor layer.

Optionally, after the heating treatment, it may be set to remove an oxide film that may be formed during a heating process, and a solution used for removing the oxide film includes fluorine. Specifically, a solution including HF, $NH_4F$, or the like may be used to remove the oxide film.

In Step 5, the second auxiliary layer may be a dielectric film such as silicon oxide, silicon nitride, or the like.

In Step 6, the third doped layer 5, the second doped layer 6, and the second interface layer 4 below the second doped layer and the third doped layer are removed by using an etching slurry or laser.

Preferably, when the third doped layer 5, the second doped layer 6, and the second interface layer 4 below the second doped layer and the third doped layer are removed, a part of the semiconductor substrate 1 below the second interface layer 4 may be further removed, to increase a depth of the isolation region 10, where a deeper isolation region 10 brings a better isolation effect. In general, a specific amount of a dopant in the first semiconductor layer or the second semiconductor layer may run through the interface layer and enter the semiconductor substrate. Therefore, doping in the semiconductor substrate 1 may be the same as the content described above and has a risk of current leakage or heat generation caused by breakdown, so that extending of the isolation region 10 into the semiconductor substrate 1 may reduce the risk of current leakage or heat generation caused by breakdown.

Further, after the etching step is completed, the second auxiliary layer is removed.

The method further includes the following steps:

Step 7: Form a back passivation layer 7 on the third doped layer 5 and a surface of a side of the second doped layer 6 facing away from the second interface layer 4, and form a front passivation layer on a surface of a side of the semiconductor substrate 1 facing away from the first interface layer 2.

Step 8: Form a first electrode 8 extending through the back passivation layer 7 on the third doped layer 5, and form a second electrode 9 extending through the back passivation layer 7 on the second doped layer 6.

Specifically, there are a plurality of methods for forming the electrodes. For example, a fire-through paste may be directly coated on the back passivation layer 7, the electrode paste then extends through the back passivation layer 7 through heat treatment to form contact with the third doped layer 5 and the second doped layer 6. Alternatively, holes may be provided on the back passivation layer 7 first, and the electrodes are then formed by using methods such as an electrode paste, a laser transfer printing method, electroplating, chemical plating, light induced plating, or the like, or by using physical vapor deposition methods such as evaporation, sputtering, or the like. Apparently, the electrodes may be formed through a combination of one or more of the foregoing methods.

A fabrication method of the second solar cell includes the following steps:

Step 1: Provide a semiconductor substrate 1.

Step 2: Form a first doped layer 3 on a surface of a side of the semiconductor substrate 1.

Specifically, a first interface layer 2 is formed on a surface of a side of the semiconductor substrate 1 through a low pressure chemical vapor deposition (LPCVD) method at a temperature ranging from 400° C. to 700° C.

In a specific implementation, the first doped layer 3 is formed on a surface of a side of the first interface layer 2 facing away from the semiconductor substrate 1 through in-situ doping and the LPCVD method.

In another specific implementation, a first semiconductor layer is formed on a surface of a side of the first interface layer 2 facing away from the semiconductor substrate 1, and the first dopant is doped into the first semiconductor layer to form the first doped layer 3.

The first semiconductor layer may be a polysilicon layer, a microcrystalline silicon layer, or an amorphous silicon layer.

In the first doped layer 3, a peak doping concentration of the first dopant ranges from $1\times10^{19}$ atoms/cm$^3$ to $5\times10^{21}$ atoms/cm$^3$.

Step 3: Pattern the first doped layer 3 to retain a part of the first doped layer 3.

Specifically, a first auxiliary layer is formed on a surface of a side of the first doped layer 3 facing away from the semiconductor substrate 1, and etching is then performed on the first auxiliary layer and the first doped layer 3 on the second region, to complete patterning and retain the first doped layer 3 in the first region only.

Specifically, the first auxiliary layer may be a dielectric film such as silicon oxide, silicon nitride, or the like. Preferably, a silicon oxide film formed in the foregoing phosphorus doping may be used as the first auxiliary layer. The first auxiliary layer is then patterned. For example, a pattern may be printed by using an etching slurry to remove the first auxiliary layer, the first doped layer 3, and the first interface layer 2 that are outside the first region, or short-pulse laser may be used to remove the first auxiliary layer, the first doped layer 3, and the first interface layer 2 that are outside the first region.

In a preferred solution, an alkali solution is used to remove the first doped layer 3 and the first interface layer 2 that are outside the first region, and the alkali solution is also used to form a textured structure on a surface of the semiconductor substrate 1 in the second region. By using the alkali solution, the first doped layer 3 in the first region is patterned, and a textured surface in the second region is also fabricated. In this way, an IBC fabrication procedure is greatly simplified, and a current commonly used single-surface texturing process may be omitted.

In the related art, there are two methods for implementing single-surface texturing: A first method is to first polish both surfaces of a silicon wafer, fabricate a first auxiliary layer on a single surface, then perform texturing on the single surface, and remove the first auxiliary layer after texturing.

A second method is to first polish both surfaces of a silicon wafer, fabricate a first auxiliary layer on a single surface, then polish the single surface, and remove the first auxiliary layer.

The existing two single-surface texturing methods are both complicated, and a single-surface texturing process needs to be completed from the very beginning of a solar cell fabrication process. The single-surface texturing process needs to be completed through at least four procedures. In addition, the textured surface may be damaged in a subsequent normal solar cell fabrication process, reducing an anti-reflection effect of the textured surface of the solar cell.

Step 4: Form a third doped layer 5 on a surface of a side of the first doped layer 3 facing away from the semiconductor substrate 1 through heating treatment, and form a second doped layer 6 on a first surface of the semiconductor substrate 1 not covered by the first doped layer 3. Specifically, before the second doped layer and the third doped layer are formed, a second interface layer 4 may be first formed, where the second interface layer 4 not only covers the surface of the side of the first doped layer facing away from the semiconductor substrate and a side surface, but also covers the first surface of the semiconductor substrate not covered by the first doped layer.

In a specific implementation, the second doped layer 6 is formed on a surface of a side of the second interface layer 4 facing away from the semiconductor substrate 1 and the first doped layer 3 through in-situ doping and the LPCVD method, where the in-situ doping refers to that deposition and doping of amorphous silicon are completed simultaneously. Heating treatment is then performed on the second doped layer 6 on the first doped layer 3, to diffuse the first dopant in the first doped layer 3 into the second doped layer 6 on the first doped layer, and the second dopant in the second doped layer 6 on the first doped layer is also diffused into the first doped layer 3, to transform the second doped layer 6 on the first doped layer 3 into the third doped layer 5. The second doped layer 6 on the first surface not covered by the first doped layer 3 is still the second doped layer 6.

Specifically, the heating treatment is laser treatment or heat treatment. When the laser treatment is performed, in the third doped layer 5, a region directly irradiated by laser is a region having the first conductivity type (the region having the first conductivity type extends through the third doped layer 5 in a thickness direction), a conductivity type of the region having the first conductivity type is the same as the conductivity type of the first doped layer 3, and a doping concentration of the first dopant in the region having the first conductivity type is greater than a doping concentration of the second dopant in the region having the first conductivity type. Power of the laser treatment is greater than 5 W, and preferably ranges from 5 W to 30 W, bringing a better heating effect. A wavelength of the laser treatment is longer than 500 nm. For example, a green light laser emitter whose wavelength is 532 nm may be used for the laser treatment; a yellow light laser emitter whose wavelength is 589 nm may be used for the laser treatment; a red light laser emitter whose wavelength is 635 nm, 660 nm, 660 nm, 670 nm, or 671 nm may be used for the laser treatment; or infrared laser whose wavelength is 808 nm, 914 nm, 946 nm, 980 nm, 1047 nm, 1053 nm, 1064 nm, 1320 nm, or 1342 nm may be used for the laser treatment.

In another specific implementation, a second semiconductor layer is formed on a surface of a side of the second interface layer 4 facing away from the semiconductor substrate 1 and the first doped layer 3, under a heating condition, the second dopant is diffused into the second semiconductor layer, and due to a high temperature, the first dopant in the first doped layer 3 is also diffused into the second semiconductor layer on the first doped layer, to transform the second semiconductor layer on the first doped layer 3 into the third doped layer 5 and transform the second semiconductor layer on the first surface of the semiconductor substrate 1 into the second doped layer 6.

Specifically, in the third doped layer 5, conductivity types of at least some regions close to the first doped layer 3 are the same as the conductivity type of the first doped layer 3.

In the first doped layer 3, a peak doping concentration of the first dopant ranges from $1 \times 10^{19}$ atoms/cm$^3$ to $3 \times 10^{21}$ atoms/cm$^3$, and a peak doping concentration of the second dopant ranges from $1 \times 10^{19}$ atoms/cm$^3$ to $3 \times 10^{19}$ atoms/cm$^3$.

In the at least some regions in the third doped layer 5, a peak doping concentration of the first dopant ranges from $1 \times 10^{20}$ atoms/cm$^3$ to $5 \times 10^{20}$ atoms/cm$^3$, and a peak doping concentration of the second dopant ranges from $1 \times 10^{19}$ atoms/cm$^3$ to $3 \times 10^{19}$ atoms/cm$^3$.

In the second doped layer 6, a peak doping concentration of the second dopant ranges from $1 \times 10^{19}$ atoms/cm$^3$ to $3 \times 10^{19}$ atoms/cm$^3$.

Specifically, a heating peak temperature of the heating treatment or under a heating condition is 850° C. or higher, preferably 900° C. or higher, and more preferably 1000° C. For example, the heating peak temperature is 850° C., 900° C., 1000° C., 1100° C., 1200° C., or the like. At the peak temperature, a heating duration is 10 min or longer, and preferably, 30 min or longer. For example, the heating duration may be 10 min, 20 min, 30 min, 40 min, 50 min, 60 min, or the like.

The second semiconductor layer may be a polysilicon layer, a microcrystalline silicon layer, or an amorphous silicon layer. The peak temperature of the heating treatment is relatively high, so that amorphous silicon or microcrystalline silicon in the second semiconductor layer may be transformed into polysilicon, thereby improving the electrical conductivity of the second semiconductor layer.

Optionally, after the heating treatment, it may be set to remove an oxide film that may be formed during a heating process, and a solution used for removing the oxide film includes fluorine. Specifically, a solution including HF, NH$_4$F, or the like may be used to remove the oxide film.

Step 5: Form a second auxiliary layer on the third doped layer 5 and a surface of a side of the second doped layer 6 facing away from a second interface layer 4 respectively, where the second auxiliary layer does not cover a position close to a junction of the third doped layer 5 and the second doped layer 6.

The second auxiliary layer may be a dielectric film such as silicon oxide, silicon nitride, or the like.

Step 6: Perform etching on the third doped layer 5 and the second doped layer 6 not covered by the second auxiliary layer, to expose the semiconductor substrate 1 (the exposed semiconductor substrate 1 is referred to as an isolation region 10), where an isolation region 10 is formed on the third doped layer 5, the second interface layer 4, the first doped layer 3, a side surface of a first interface layer 2 close to the isolation region 10, a surface of the semiconductor substrate 1 close to the isolation region 10, the second interface layer 4, and a side surface of the second doped layer 6 close to the isolation region 10.

The first doped layer 3 includes a first dopant and a second dopant;

the second doped layer 6 includes the second dopant;

the third doped layer 5 includes the first dopant and the second dopant;

a conductivity type of the first doped layer 3 is opposite to a conductivity type of the second doped layer 6; and conductivity types of at least some regions in the third doped layer 5 are the same as the conductivity type of the first doped layer.

Specifically, the third doped layer 5, the second doped layer 6, and the second interface layer 4 below the second doped layer and the third doped layer are removed by using an etching slurry or laser.

Preferably, when the third doped layer 5, the second doped layer 6, and the second interface layer 4 below the second doped layer and the third doped layer are removed, a part of the semiconductor substrate 1 below the second interface layer 4 may be further removed, to increase a depth of the isolation region 10, where a deeper isolation region 10 brings a better isolation effect. In general, a specific amount of a dopant in the first semiconductor layer or the second semiconductor layer may run through the interface layer and enter the semiconductor substrate. Therefore, doping in the semiconductor substrate 1 may be the same as the content described above and has a risk of current leakage or heat generation caused by breakdown, so that extending of the isolation region 10 into the semiconductor substrate 1 may reduce the risk of current leakage or heat generation caused by breakdown.

Further, after the etching step is completed, the second auxiliary layer is removed.

Step 7: Form a back passivation layer 7 on the third doped layer 5 and a surface of a side of the second doped layer 6 facing away from the second interface layer 4, and form a front passivation layer on a surface of a side of the semiconductor substrate 1 facing away from the first interface layer 2.

Step 8: Form a first electrode 8 extending through the back passivation layer 7 on the third doped layer 5, and form a second electrode 9 extending through the back passivation layer 7 on the second doped layer 6.

Specifically, there are a plurality of methods for forming the electrodes. For example, a fire-through paste may be directly coated on the back passivation layer 7, the electrode paste then extends through the back passivation layer 7 through heat treatment to form contact with the third doped layer 5 and the second doped layer 6. Alternatively, holes may be provided on the back passivation layer 7 first, and the electrodes are then formed by using methods such as an electrode paste, a laser transfer printing method, electroplating, chemical plating, light induced plating, or the like, or by using physical vapor deposition methods such as evaporation, sputtering, or the like. Apparently, the electrodes may be formed through a combination of one or more of the foregoing methods.

A fabrication method of the second solar cell includes the following steps:

Step 1: Provide a semiconductor substrate 1.

Step 2: Form a first doped layer 3 on a surface of a side of the semiconductor substrate 1.

Specifically, a first interface layer 2 is formed on a surface of a side of the semiconductor substrate 1 through a low pressure chemical vapor deposition (LPCVD) method at a temperature ranging from 400° C. to 700° C.

In a specific implementation, the first doped layer 3 is formed on a surface of a side of the first interface layer 2 facing away from the semiconductor substrate 1 through in-situ doping and the LPCVD method.

In another specific implementation, a first semiconductor layer is formed on a surface of a side of the first interface layer 2 facing away from the semiconductor substrate 1, and the first dopant is doped into the first semiconductor layer through diffusion to form the first doped layer 3.

The first semiconductor layer may be a polysilicon layer, a microcrystalline silicon layer, or an amorphous silicon layer.

In the first doped layer 3, a peak doping concentration of the first dopant ranges from $1 \times 10^{19}$ atoms/cm$^3$ to $5 \times 10^{21}$ atoms/cm$^3$.

Step 3: Pattern the first doped layer 3 to retain a part of the first doped layer 3.

Specifically, a first auxiliary layer is formed on a surface of a side of the first doped layer 3 facing away from the semiconductor substrate 1, and etching is then performed on the first auxiliary layer and the first doped layer 3 on the second region, to complete patterning and retain the first doped layer 3 in the first region only.

Specifically, the first auxiliary layer may be a dielectric film such as silicon oxide, silicon nitride, or the like. Preferably, a silicon oxide film formed in the foregoing phosphorus doping may be used as the first auxiliary layer. The first auxiliary layer is then patterned. For example, a pattern may be printed by using an etching slurry to remove the first auxiliary layer, the first doped layer 3, and the first interface layer 2 that are outside the first region, or short-pulse laser may be used to remove the first auxiliary layer, the first doped layer 3, and the first interface layer 2 that are outside the first region.

In a preferred solution, an alkali solution is used to remove the first doped layer 3 and the first interface layer 2 that are outside the first region, and the alkali solution is also used to form a textured structure on a surface of the semiconductor substrate 1 in the second region. By using the alkali solution, the first doped layer 3 in the first region is patterned, and a textured surface in the second region is also fabricated. In this way, an IBC fabrication procedure is greatly simplified, and a current commonly used single-surface texturing process may be omitted.

In the related art, there are two methods for implementing single-surface texturing: A first method is to first polish both surfaces of a silicon wafer, fabricate a first auxiliary layer on a single surface, then perform texturing on the single surface, and remove the first auxiliary layer after texturing.

A second method is to first polish both surfaces of a silicon wafer, fabricate a first auxiliary layer on a single surface, then polish the single surface, and remove the first auxiliary layer.

The existing two single-surface texturing methods are both complicated, and a single-surface texturing process needs to be completed from the very beginning of a solar cell fabrication process. The single-surface texturing process needs to be completed through at least four procedures. In addition, the textured surface may be damaged in a subsequent normal solar cell fabrication process, reducing an anti-reflection effect of the textured surface of the solar cell.

Step 4: Form a second interface layer 4 first, where the second interface layer 4 not only covers a surface of a side of the first doped layer facing away from the semiconductor substrate and a side surface, but also covers a first surface of the semiconductor substrate not covered by the first doped layer.

A second doped layer 6 is formed on a surface of a side of the second interface layer 4 facing away from the semiconductor substrate 1 and the first doped layer 3 through in-situ doping and the LPCVD method, where the in-situ doping refers to that deposition and doping of amorphous silicon are completed simultaneously.

A second auxiliary layer is formed on a surface of a side of the second doped layer 6 facing away from the second interface layer 4, and the second auxiliary layer does not cover a junction of the second doped layer 6 on the first surface of the semiconductor substrate 1 and the first doped layer.

Etching is performed on the first doped layer 3 not covered by the second auxiliary layer, the second doped layer 6, the first interface layer, and the second interface layer, to expose the first surface of the semiconductor substrate, so that an isolation region 10 exists between the first doped layer 3 and the second doped layer 6. The second auxiliary layer is then removed.

The second auxiliary layer may be a dielectric film such as silicon oxide, silicon nitride, or the like.

Preferably, when the first doped layer 3, the second doped layer 6, and the first interface layer and the second interface layer 4 respectively below the first doped layer and the second doped layer are removed to expose the first surface of the semiconductor substrate 1, a part of the semiconductor substrate 1 may be further removed, to increase a depth of the isolation region 10, where a deeper isolation region 10 brings a better isolation effect. In general, a specific amount of a dopant in the first semiconductor layer or the second semiconductor layer may run through the interface layer and enter the semiconductor substrate. Therefore, doping in the semiconductor substrate 1 may be the same as the content described above and has a risk of current leakage or heat generation caused by breakdown, so that extending of the isolation region 10 into the semiconductor substrate 1 may reduce the risk of current leakage or heat generation caused by breakdown.

Further, after the etching step is completed, the second auxiliary layer is removed. Step 5: Perform heating treatment on a second doped layer 6 on the first doped layer 3, to diffuse a first dopant in the first doped layer 3 into the second doped layer 6 on the first doped layer, where a second dopant in the second doped layer 6 on the first doped layer is also diffused into the first doped layer 3, to transform the second doped layer 6 on the first doped layer 3 into a third doped layer 5. The second doped layer 6 on the first surface not covered by the first doped layer 3 is still the second doped layer 6.

Specifically, in the third doped layer 5, conductivity types of at least some regions close to the first doped layer 3 are the same as the conductivity type of the first doped layer 3.

In the first doped layer 3, a peak doping concentration of the first dopant ranges from $1\times10^{19}$ atoms/cm³ to $3\times10^{21}$ atoms/cm³, and a peak doping concentration of the second dopant ranges from $1\times10^{19}$ atoms/cm³ to $3\times10^{19}$ atoms/cm³.

In the at least some regions in the third doped layer 5, a peak doping concentration of the first dopant ranges from $1\times10^{20}$ atoms/cm³ to $5\times10^{20}$ atoms/cm³, and a peak doping concentration of the second dopant ranges from $1\times10^{19}$ atoms/cm³ to $3\times10^{19}$ atoms/cm³.

In the second doped layer 6, a peak doping concentration of the second dopant ranges from $1\times10^{19}$ atoms/cm³ to $3\times10^{19}$ atoms/cm³.

Specifically, a heating peak temperature of the heating treatment or under a heating condition is 850° C. or higher, preferably 900° C. or higher, and more preferably 1000° C. For example, the heating peak temperature is 850° C., 900° C., 1000° C., 1100° C., 1200° C., or the like. At the peak temperature, a heating duration is 10 min or longer, and preferably, 30 min or longer. For example, the heating duration may be 10 min, 20 min, 30 min, 40 min, 50 min, 60 min, or the like.

The second semiconductor layer may be a polysilicon layer, a microcrystalline silicon layer, or an amorphous silicon layer. The peak temperature of the heating treatment is relatively high, so that amorphous silicon or microcrystalline silicon in the second semiconductor layer may be transformed into polysilicon, thereby improving the electrical conductivity of the second semiconductor layer.

Optionally, after the heating treatment, it may be set to remove an oxide film that may be formed during a heating process, and a solution used for removing the oxide film includes fluorine. Specifically, a solution including HF, NH₄F, or the like may be used to remove the oxide film.

The first doped layer 3 includes a first dopant and a second dopant;

the second doped layer 6 includes the second dopant;

the third doped layer 5 includes the first dopant and the second dopant;

a conductivity type of the first doped layer 3 is opposite to a conductivity type of the second doped layer 6; and conductivity types of at least some regions in the third doped layer 5 are the same as the conductivity type of the first doped layer.

Step 6: Form a back passivation layer 7 on the third doped layer 5 and a surface of a side of the second doped layer 6 facing away from the second interface layer 4, and form a front passivation layer on a surface of a side of the semiconductor substrate 1 facing away from a first interface layer 2.

Step 7: Form a first electrode 8 extending through the back passivation layer 7 on the third doped layer 5, and form a second electrode 9 extending through the back passivation layer 7 on the second doped layer 6.

Specifically, there are a plurality of methods for forming the electrodes. For example, a fire-through paste may be directly coated on the back passivation layer 7, the electrode paste then extends through the back passivation layer 7 through heat treatment to form contact with the third doped layer 5 and the second doped layer 6. Alternatively, holes may be provided on the back passivation layer 7 first, and the electrodes are then formed by using methods such as an electrode paste, a laser transfer printing method, electroplating, chemical plating, light induced plating, or the like, or by using physical vapor deposition methods such as evaporation, sputtering, or the like. Apparently, the electrodes may be formed through a combination of one or more of the foregoing methods.

FIGS. 3A-3L illustrate another method of fabricating a solar cell, according to some aspects of the present disclosure.

Figure 3A:
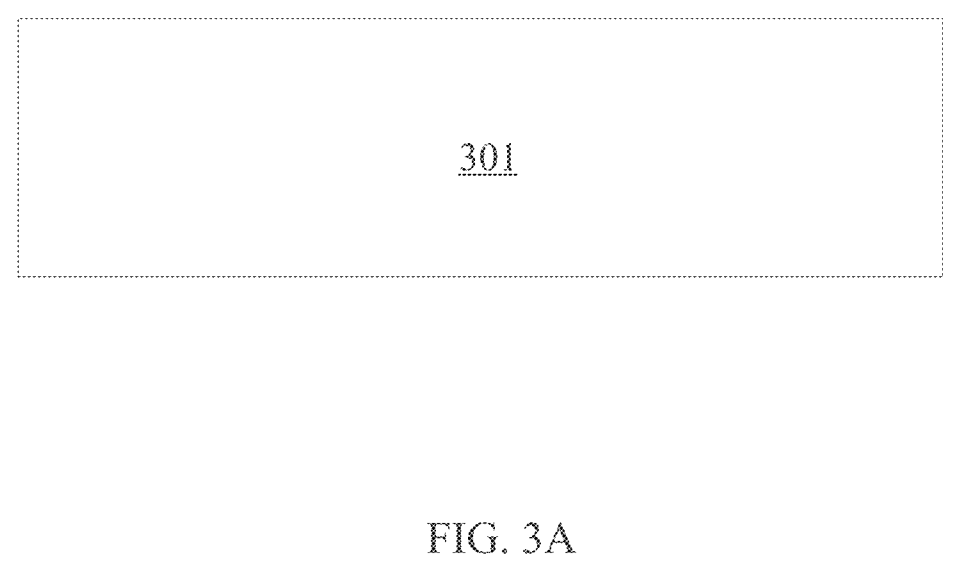

For step 1, as shown in FIG. 3A, a semiconductor substrate 301 (e.g., the semiconductor substrate 1 of FIGS. 1-2) is provided. In some implementations, surfaces of the semiconductor substrate 301 are treated by polishing or by wet chemical treatment, for example, to remove damages and contaminants on the surfaces of the semiconductor substrate 301.

Figure 3B:
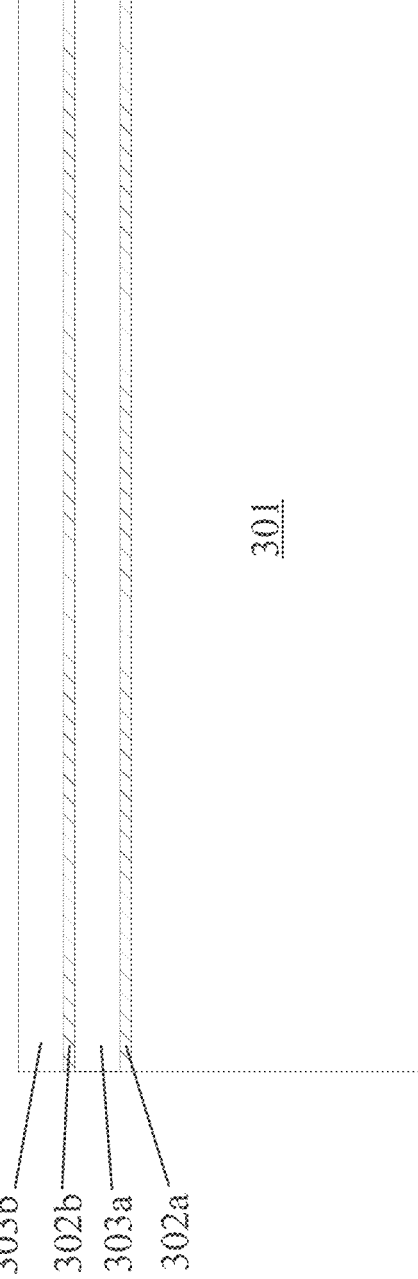

For step 2, as shown in FIG. 3B, a first tunnel oxide layer 302a is formed on a surface of the semiconductor substrate 301. The first tunnel oxide layer 302a can be formed through processes such as thermal oxidation, wet oxidation, or ozone oxidation. For example, the semiconductor substrate 301 is exposed to oxygen, ozone, nitrous oxide, or other oxidizing gas under specific conditions to form a thin, insulating oxide layer on the silicon surface.

A first semiconductor layer 303a is formed on top of the first tunnel oxide layer 302a. The second semiconductor layer 303b can be formed through an LPCVD method.

Further, a second tunnel oxide layer 302b is formed on top of the first semiconductor layer 303a, for example, through processes such as thermal oxidation, wet oxidation or ozone oxidation. A second semiconductor layer 303b is formed on top of the second tunnel oxide layer 302b, for example, through an LPCVD method.

In some implementations, the crystallization rate of the second semiconductor layer 303b is the same as the crystallization rate of the first semiconductor layer 303a. For example, both the first semiconductor layer 303a and the second semiconductor layer 303b can be polysilicon layers. In some implementations, the crystallization rate of the second semiconductor layer 303b is lower than the crystallization rate of the first semiconductor layer 303a. For example, the first semiconductor layer 303a can be a polysilicon layer, and the second semiconductor layer 303b can be an amorphous silicon layer or a polysilicon layer doped with amorphous silicon. As such, by forming the second semiconductor layer 303b with a lower crystallization rate and a lower densification rate, the process of forming the second semiconductor layer 303b can take less time than forming the first semiconductor layer 303a. For example, the first semiconductor layer 303a can be formed using a LPCVD method, while the second semiconductor layer 303b can be formed using a plasma enhanced chemical vapor deposition (PECVD) method, which is faster than the LPCVD method, or using a LPCVD method with higher temperature and higher gas flux rate, so that the second semiconductor layer 303b can be formed faster.

In some implementations, the thickness of the second semiconductor layer 303b (e.g., the third doped layer 5 of FIGS. 1-2) is greater than the thickness of the first semiconductor layer 303a (e.g., the first doped layer 3 of FIGS. 1-2). Since the second semiconductor layer 303b can be formed by using a faster method than the first semiconductor layer 303a, when a larger portion of the semiconductor layers 303 are fabricated using the faster method as the second semiconductor layer 303b, the total fabrication time can be reduced, which can increase the fabrication yield.

Figure 3C:
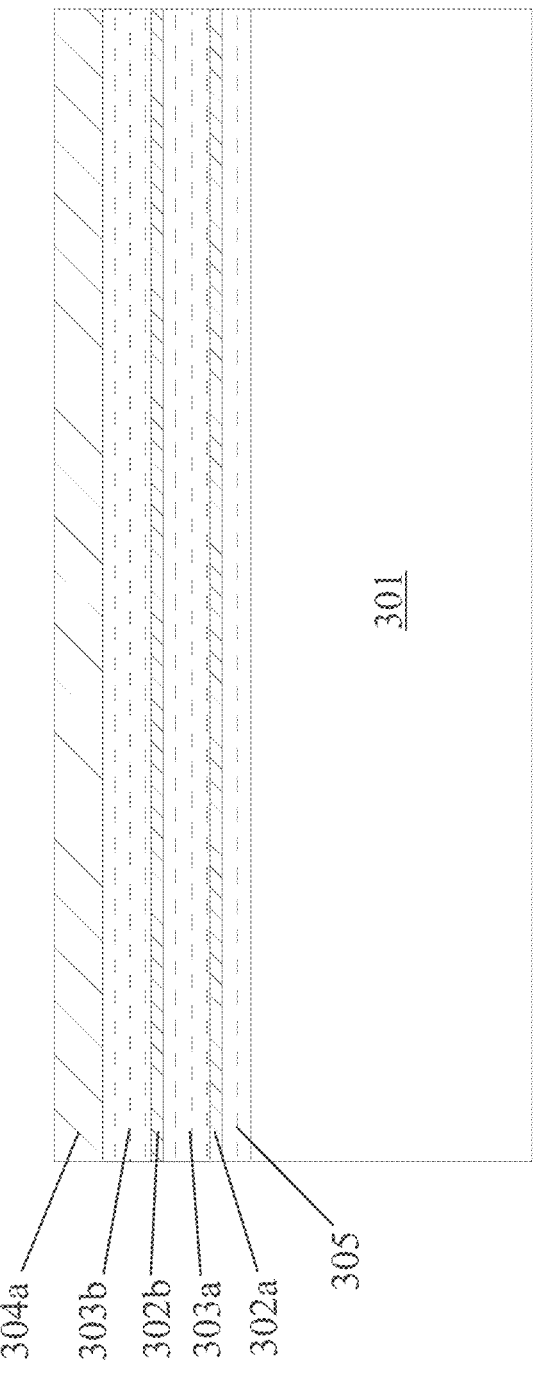

For step 3, as shown in FIG. 3C, a first dopant is doped into the semiconductor layers 303a, 303b (collectively as 303), for example, through diffusion. The first dopant can include one of phosphorus, gallium, or boron. In some implementations, the first dopant can pass through the tunnel oxide layers 302a, 302b (collectively as 302) and the semiconductor layers 303 to reach the semiconductor substrate 301. A first doped region 305 having the first dopant can thereby be formed in the semiconductor substrate 301 under the first tunnel oxide layer 302a. In some implementations, during or after the process of doping the first dopant into the semiconductor layers 303, a first mask layer 304a can be formed on top of the second semiconductor layer 303b. For example, the first mask layer 304a can include silicon oxide for preventing material removal in the masked regions.

Figure 3D:
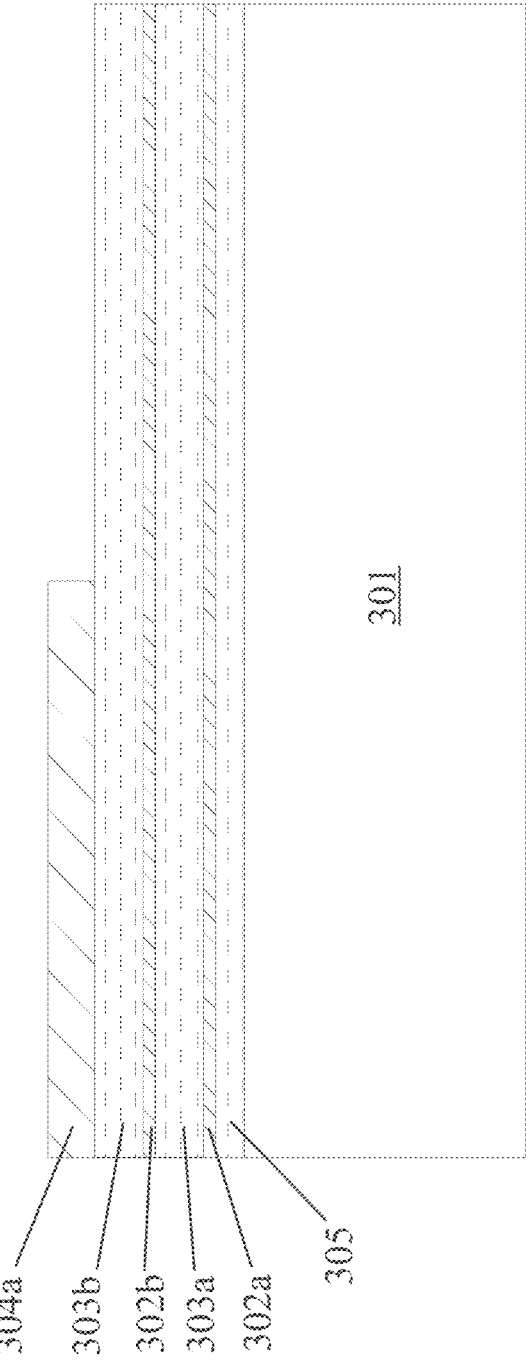
Figure 3E:
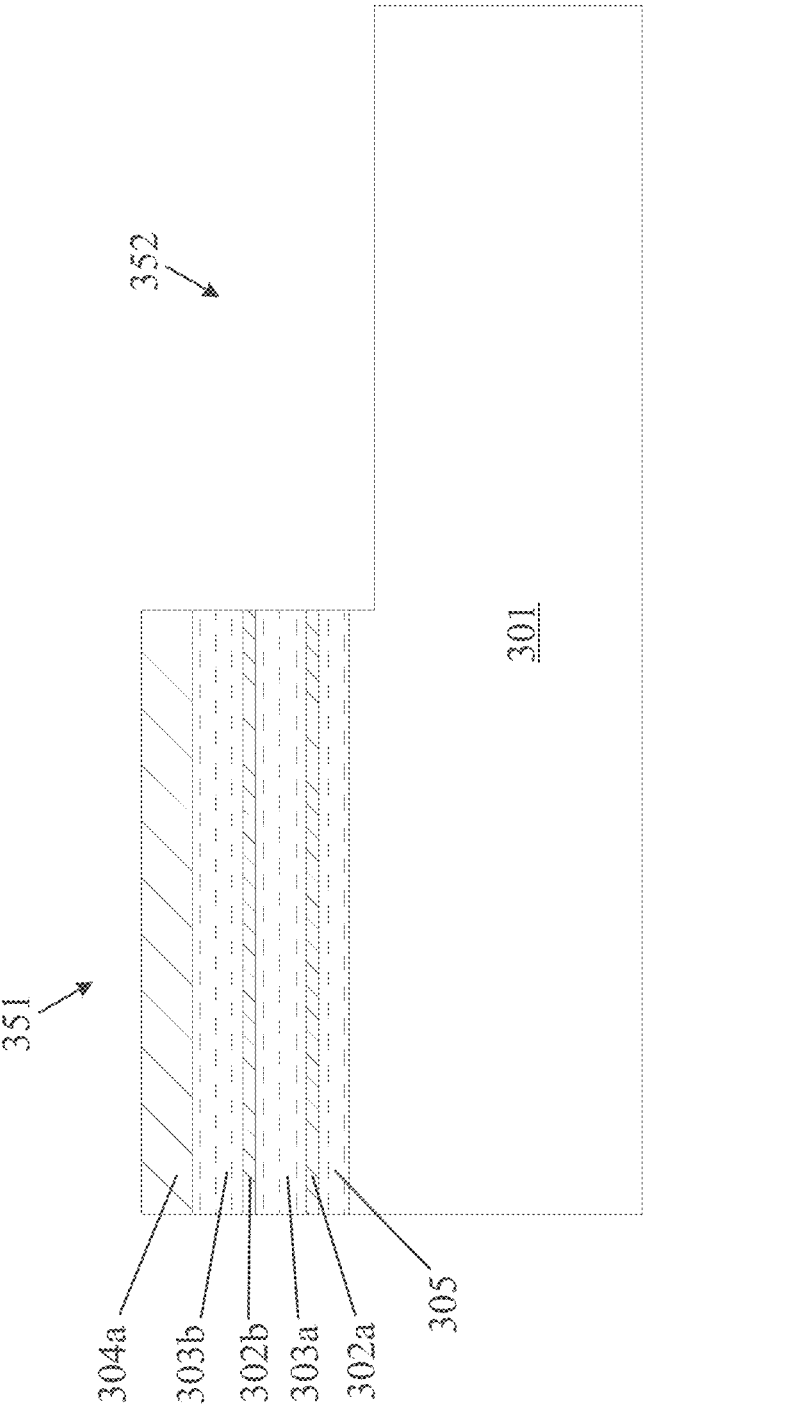

For step 4, as shown in FIG. 3D, the first mask layer 304a is patterned by removing a portion of the first mask layer 304a to expose a portion of the second semiconductor layer 303b. For example, the first mask layer 304a is patterned through lithography to form a pattern on the first mask layer 304a. After removing a portion of the first mask layer 304a, as shown in FIG. 3E, a portion of the semiconductor layers 303 that are not covered by the first mask layer 304a are removed by etching. The semiconductor layers 303 can be removed by wet etching, for example, by using alkaline etching solutions. In some implementations, since the tunnel oxide layers 302 are thin layers, a portion of the tunnel oxide layers 302 that are not covered by the first mask layer 304a are also removed during the etching process, so that a portion of the semiconductor substrate 301 is exposed. In some implementations, in a first region 351 (e.g., a P-type region), the semiconductor layers 303 and tunnel oxide layers 302 are kept in the etching process, while in a second regions 352 (e.g., a N-type region), the semiconductor layers 303 and the tunnel oxide layers 302 are removed in the etching process.

Figure 3F:
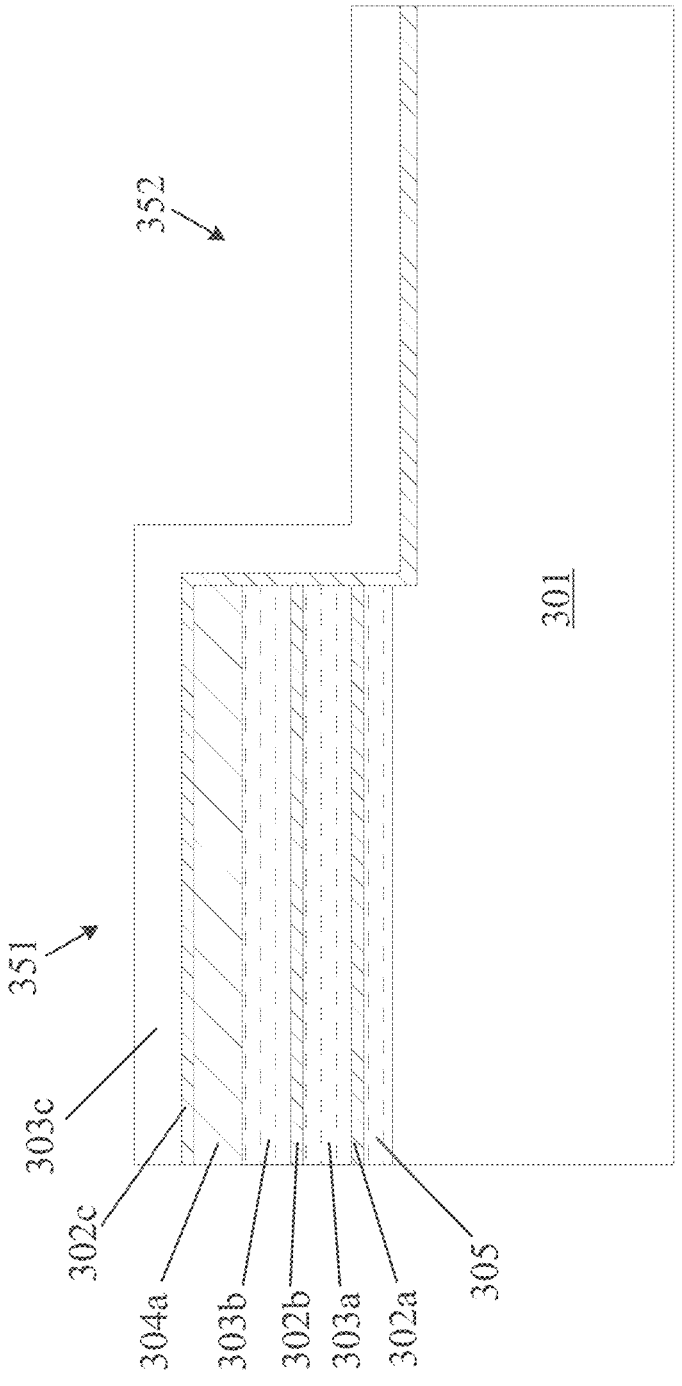

For step 5, as shown in FIG. 3F, a third semiconductor layer 303c (e.g., a polysilicon layer) is formed on top of the remaining first mask layer 304a and the exposed semiconductor substrate 301. The third semiconductor layer 303c can be formed through an LPCVD method. In some implementations, before forming the third semiconductor layer 303c, a third tunnel oxide layer 302c is formed on top of the remaining first mask layer 304a and the exposed region of the semiconductor substrate 301, so that the third semiconductor layer 303c can be formed on top of the third tunnel oxide layer 302c.

Figure 3G:
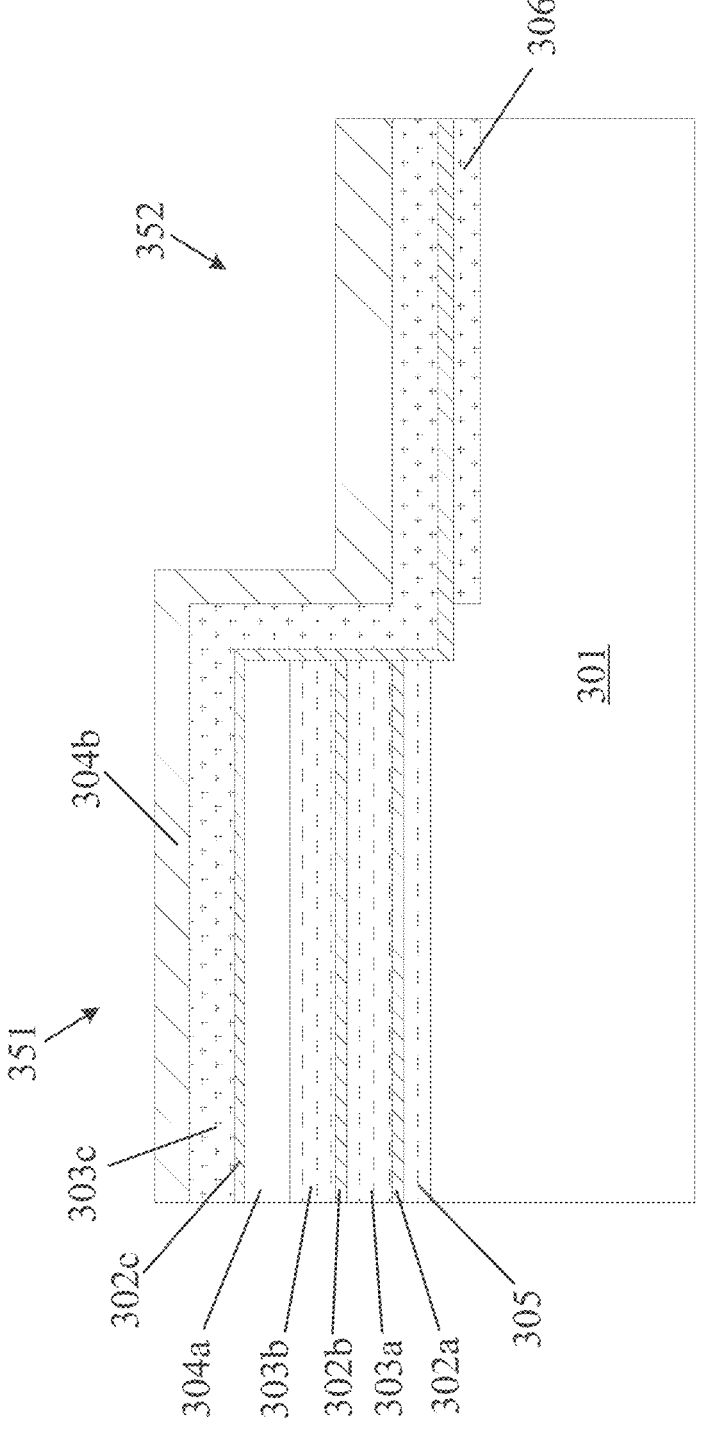

For step 6, as shown in FIG. 3G, a second dopant is doped into the third semiconductor layer 303c, for example, through diffusion. The second dopant can include one of phosphorus, gallium, or boron. The second dopant is of a different type from the first dopant. For example, the first dopant can be a P-type dopant (e.g., boron or gallium), and the second dopant can be a N-type dopant (e.g., phosphorus). In some implementations, in the second region 352, the second dopant can pass through the third semiconductor layer 303c and the third tunnel oxide layers 302c to reach the semiconductor substrate 301. A second doped region 306 having the second dopant can thereby be formed in the semiconductor substrate 301 under the third tunnel oxide layer 302c. In some implementations, in the first region 351, the second dopant can pass through the third semiconductor layer 303c, the third tunnel oxide layer 302c, and the first mask layer 304a to reach the second semiconductor layer 303b. As such, the second semiconductor layer 303b can include both the first dopant and the second dopant. In some implementations, the concentration of the first dopant in the second semiconductor layer 303b is higher than the concentration of the second dopant in the second semiconductor layer 303b, so that the conductivity type of the second semiconductor layer 303b remains unchanged (e.g., remain as P-type, when the first dopant is a P-type dopant, and the second dopant is a N-type dopant). In some implementations, the concentration of the first dopant is higher than the concentration of the second dopant in at least a portion of the second semiconductor layer 303b, so that the conductivity type of at least a portion of the second semiconductor layer 303b remains the same as the conductivity type of the first semiconductor layer 303a. For example, the conductivity type of a portion of the second semiconductor layer 303b that is close to the first semiconductor layer 303a is the same as the conductivity type of the first semiconductor layer 303a.

In some implementations, during or after the process of doping the second dopant into the third semiconductor layers 303c, a second mask layer 304b can be formed on top of the third semiconductor layer 303c. For example, the second mask layer 304b can include silicon oxide for preventing material removal in the masked regions.

Figure 3H:
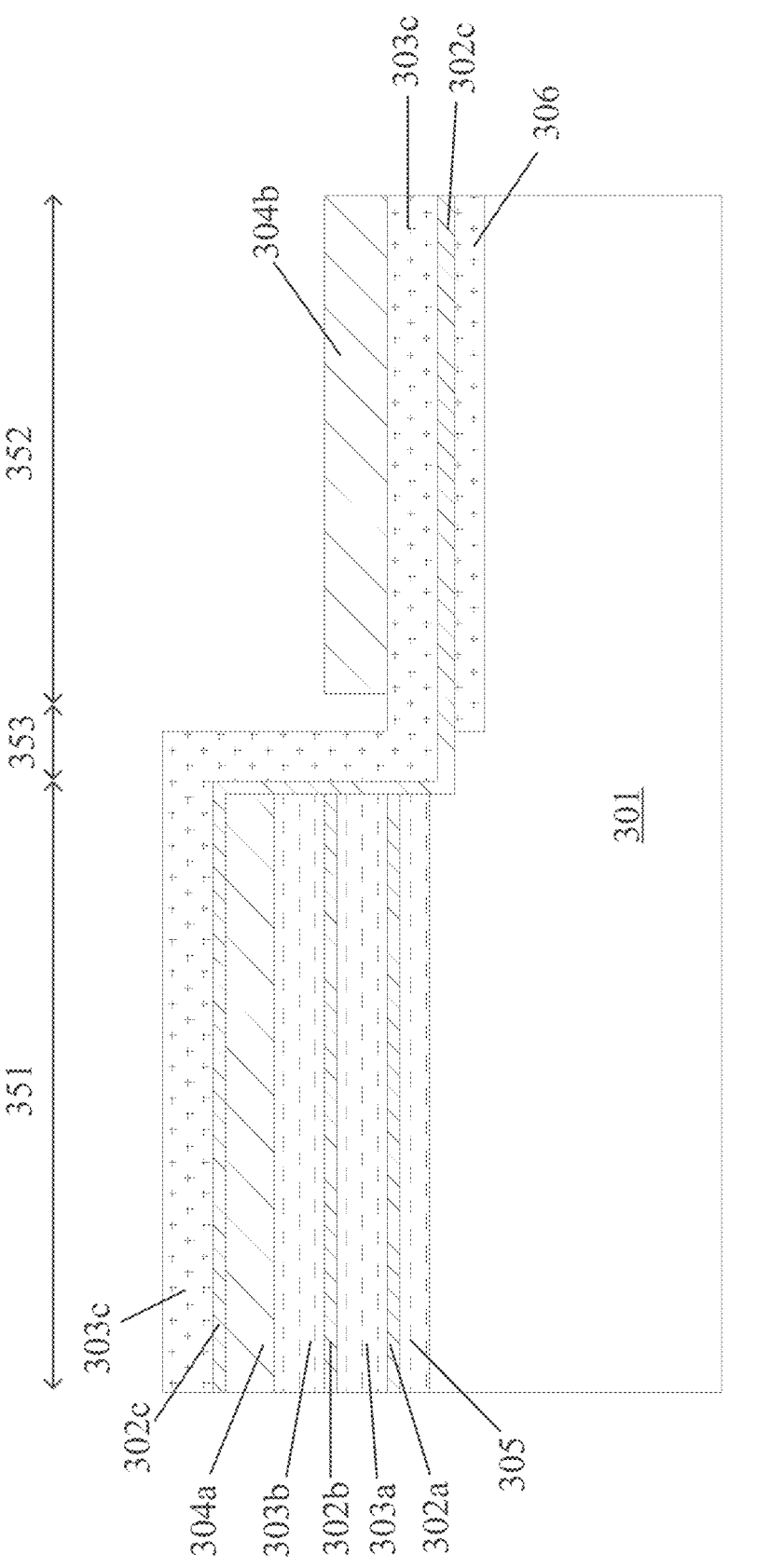
Figure 31:
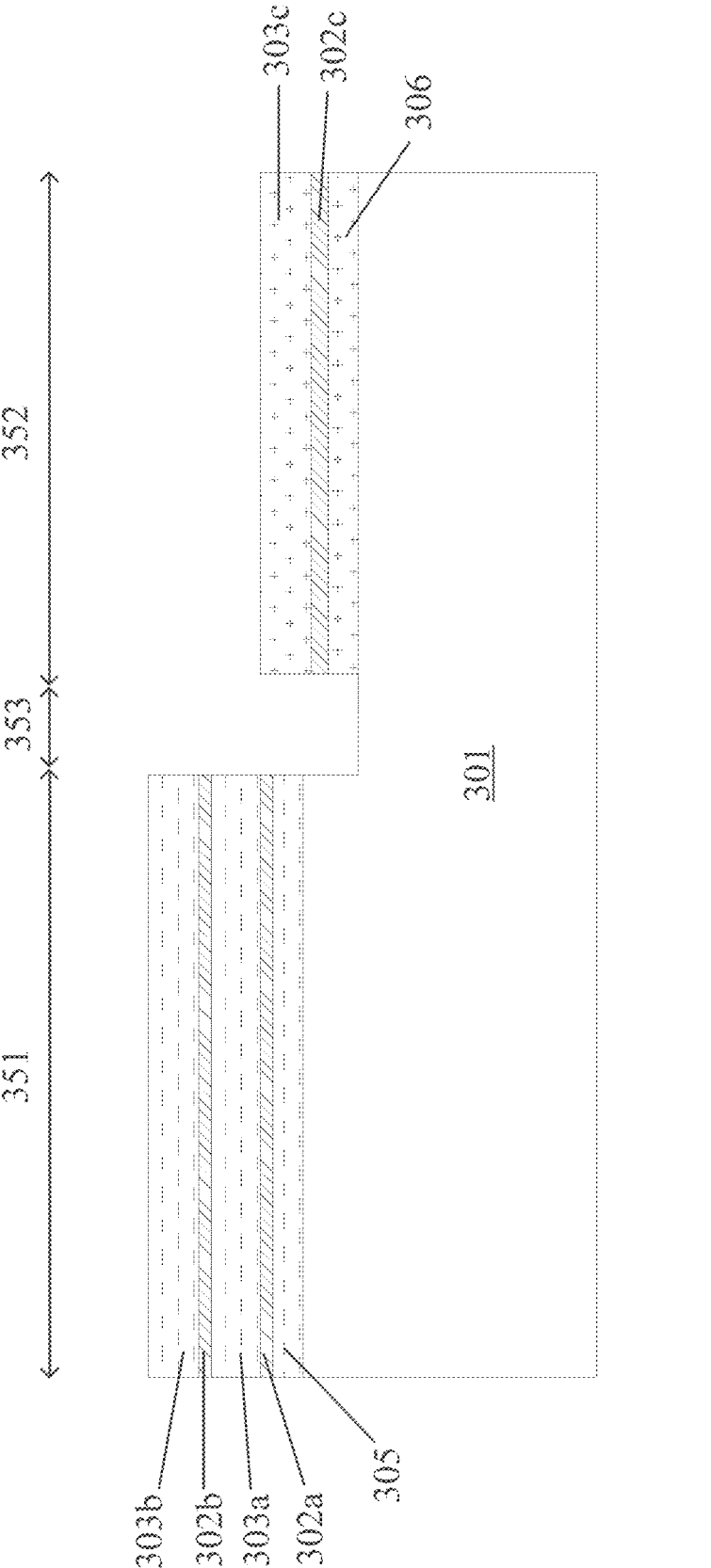

For step 7, as shown in FIG. 3H, the second mask layer 304b is patterned by removing a portion of the second mask layer 304b to expose a portion of the third semiconductor layer 303c. In some implementations, a portion of the mask layer is removed through lithography to form a pattern on the second mask layer 304b. For example, in the first region 351 and an isolation region 353 between the first region 351 and the second region 352, the second mask layer 304b is removed, while in the second region 352, the second mask layer 304b is retained.

Figure 3J:
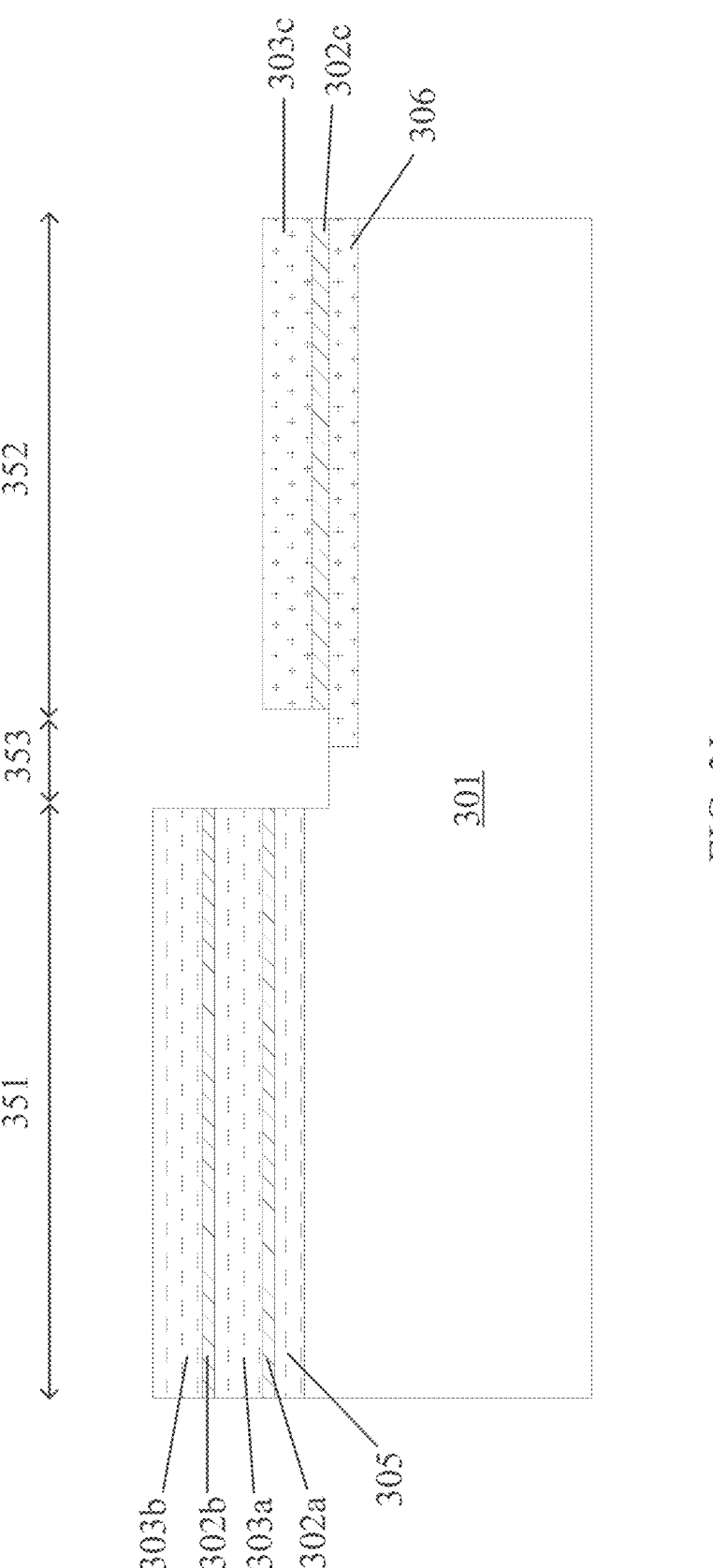

For step 8, as shown in FIG. 3I, after patterning the second mask layer 304b, a portion of the third semiconductor layer 303c and the third tunnel oxide layer 302c that are not covered by the second mask layer 304b are removed by etching, for example, by wet etching using alkaline etching solutions. For example, in the first region 351, the third semiconductor layer 303c and the third tunnel oxide layer 302c are etched away; and in the isolation region 353, the third semiconductor layer 303c, the third tunnel oxide layer 302c and the layer having the second doped region 306 are etched away to expose the semiconductor substrate 301. In some implementations, as shown in FIG. 3J, in the isolation region 353, only the third semiconductor layer 303c and the third tunnel oxide layer 302c are etched away, while the layer having the second doped region 306 is kept.

The first mask layer 304a in the first region 351 and the second mask layer 304b in the second region 352 are then removed. As such, the second semiconductor layer 303b (e.g., having a P-type conductivity) is exposed in the first region 351, the semiconductor substrate 301 is exposed in the isolation region, and the third semiconductor layer 303c (e.g., having a N-type conductivity) is exposed in the second region.

Figure 3K:
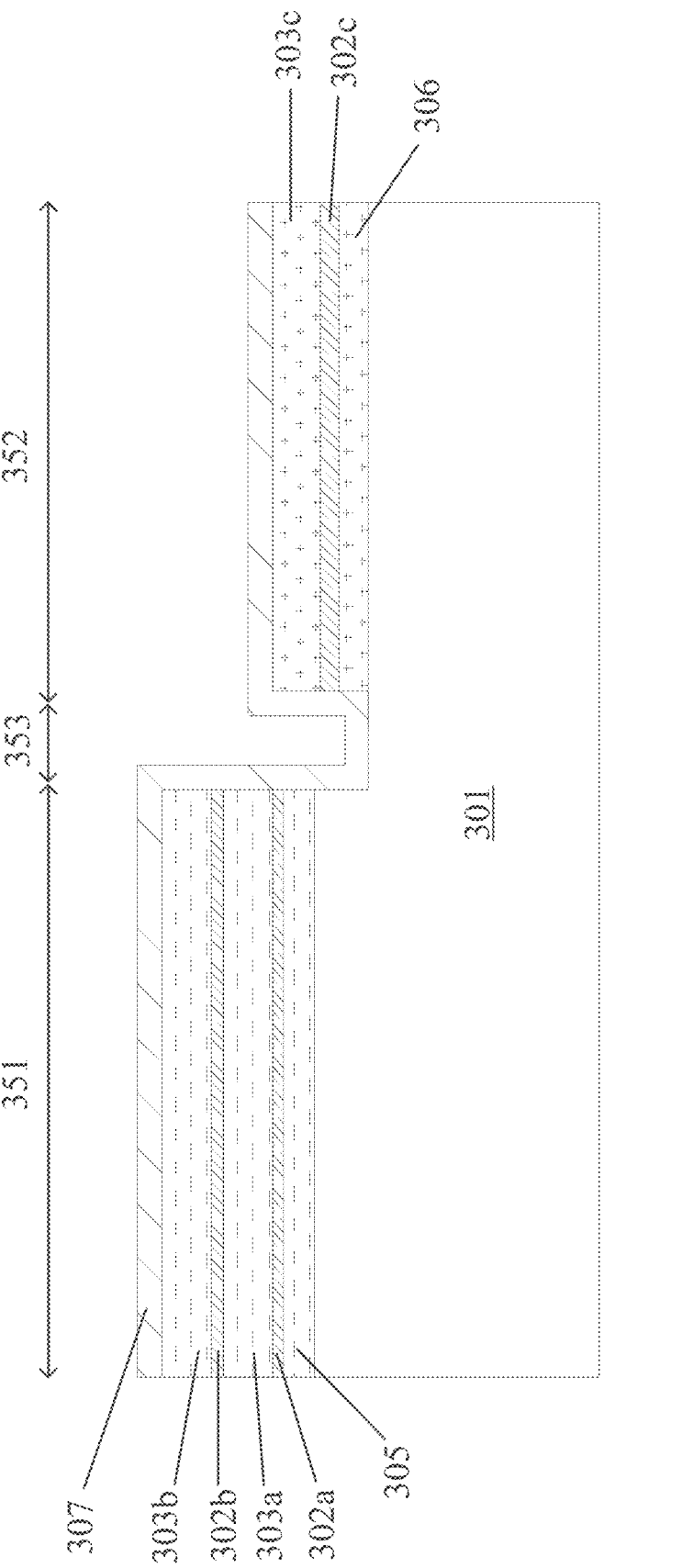

For step 9, as shown in FIG. 3K, a passivation layer 307 is formed as a top layer, e.g., through deposition. The passivation layer can include a dielectric material such as $SiO_2$, $SiN_x$, or $Al_2O_3$. The passivation layer 307 can be used to minimize the recombination of charge carriers at the surface of solar cells, thereby enhancing their efficiency and performance of the solar cells.

Figure 3L:
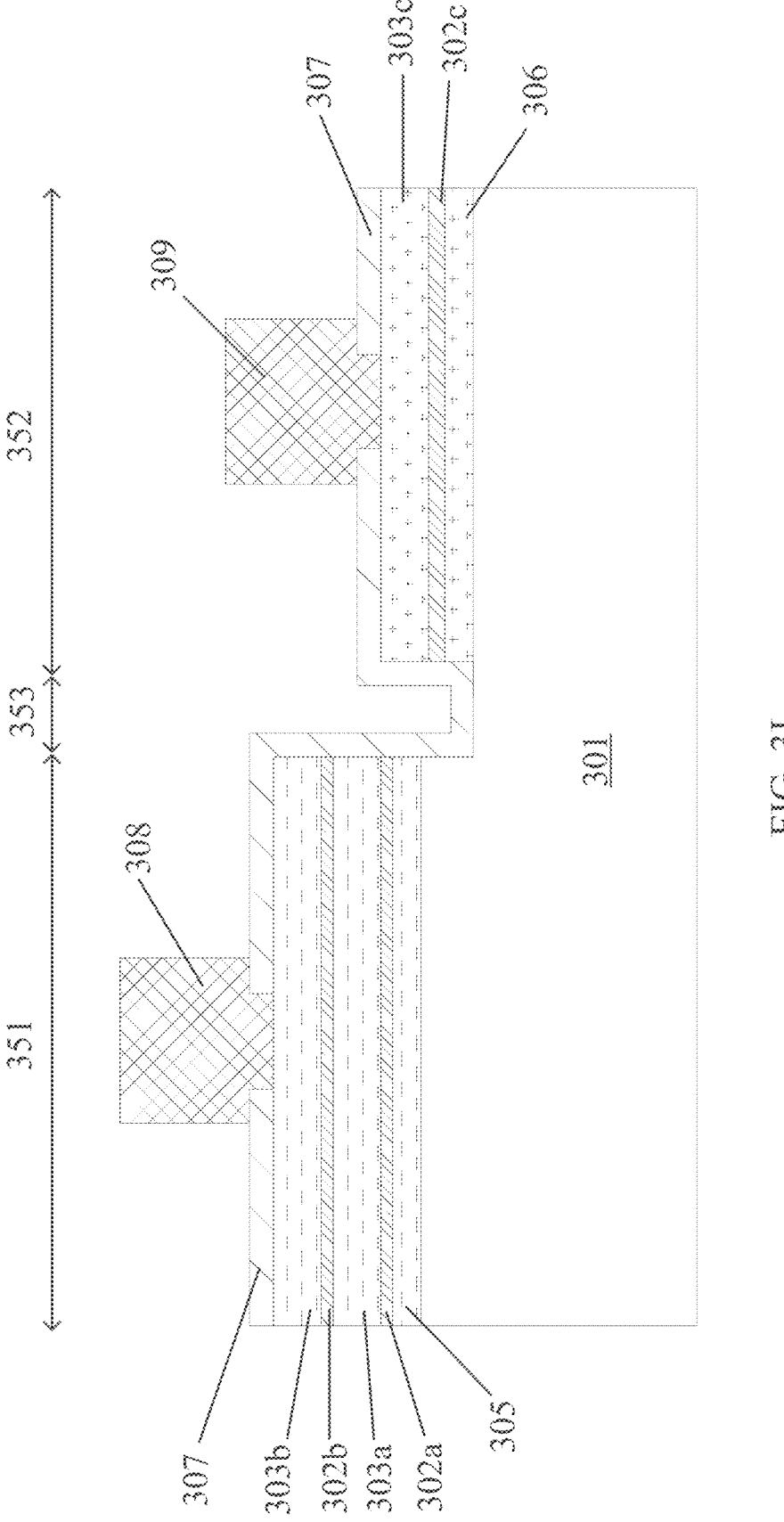

For step 10, as shown in FIG. 3L, a first electrode 308 is formed in the first region 351, and a second electrode is formed in the second region 352. For example, the first electrode 308 can be a positive electrode formed in a P-type region, and the second electrode 309 can be a negative electrode formed in a N-type region.

Referring back to FIG. 2, the semiconductor substrate 301 can be the semiconductor substrate 1 of the solar cell; the first tunnel oxide layer 302a can be the first interface layer 2 of the solar cell; the first semiconductor layer 303a can be the first doped layer 3 of the solar cell; the second tunnel oxide layer 302b can be the second interface layer 4 in the first region of the solar cell; the third tunnel oxide layer 302c can be the second interface layer 4 in the second region of the solar cell; the second semiconductor layer 303b can be the third doped layer 5 of the solar cell; the third semiconductor layer 303c can be the second doped layer 6 of the solar cell; the passivation layer 307 can be the back passivation layer 7 of the solar cell; the first electrode 308 can be the first electrode 8 of the solar cell; the second electrode 309 can be the second electrode 9 of the solar cell; the isolation region 353 can be the isolation region 10 of the solar cell; the first doped region 305 can be a third doped region (e.g., the third doped region 11 of FIG. 1) under the first interface layer 2 of the solar cell; and the second doped region 306 can be a fourth doped region (e.g., the fourth doped region 12 of FIG. 1) under the second interface layer 4 of the solar cell.

In some implementations, the first tunnel oxide layer 302a includes the first dopant. A concentration of the first dopant in the first tunnel oxide layer 302a can range from $1\times10^{18}$ atoms/cm$^3$ to $3\times10^{21}$ atoms/cm$^3$. In some implementations, the second tunnel oxide layer 302b includes the first dopant. A concentration of the first dopant in the second tunnel oxide layer 302b can range from $1\times10^{18}$ atoms/cm$^3$ to $3\times10^{21}$ atoms/cm$^3$. A thickness of the second tunnel oxide layer 302b can be the same, or substantially the same as a thickness of the first tunnel oxide layer 302a. The second tunnel oxide layer 302b can include $SiO_2$ and can be formed using LPCVD. As such, the second tunnel oxide layer 302b and the third semiconductor layer 303c can be formed consecutively in a same fabrication equipment to save fabrication time and cost.

In some implementations, the first semiconductor layer 303a (e.g., the first doped layer 3 of FIGS. 1-2) includes the first dopant and the second dopant. Doping concentrations of the first dopant and the second dopant in the first semiconductor layer 303a can change along a vertical direction perpendicular to the first semiconductor layer 303a, e.g., from a surface of the first semiconductor layer 303a facing away from the semiconductor substrate 301, to a surface of the first semiconductor layer 303a facing the semiconductor substrate 301. For example, the doping concentration of the first dopant in the first semiconductor layer 303a can first increase and then decrease along the vertical direction, and the doping concentration of the second dopant in the first semiconductor layer 303a can decrease along the vertical direction. As such, the part of the first semiconductor layer 303a that is closer to the tunnel oxide layers 302 has a lower doping concentration of the first dopant, which is beneficial for enhancing interface passivation effect. The middle part of the first semiconductor layer 303a, which is usually in contact with the first electrode 308, has a higher doping concentration of the first dopant, which is beneficial for forming good electric contact between the first electrode 308 and the first semiconductor layer 303a.

In some implementations, the second semiconductor layer 303b (e.g., the third doped layer 5 of FIGS. 1-2) includes the first dopant and the second dopant. Doping concentrations of the first dopant and/or the second dopant in the second semiconductor layer 303b can change along a vertical direction perpendicular to the second semiconductor layer 303b, e.g., from a surface of the second semiconductor layer 303b facing away from the semiconductor substrate 301, to a surface of the second semiconductor layer 303b facing the semiconductor substrate 301. For example, the doping concentration of the first dopant in the second semiconductor layer 303b can increase along the vertical direction. The doping concentration of the second dopant in the second semiconductor layer 303b can decrease, or remain consistent along the vertical direction. As such, the part of the second semiconductor layer 303b that is closer to the passivation layer 307 has a lower doping concentration of the first dopant, which is beneficial for enhancing the passivation effect. The part of the second semiconductor layer 303b that is closer to the second tunnel oxide layer 302b has a higher doping concentration of the first dopant, which is beneficial for forming good electric contact between the first electrode 308 and the second semiconductor layer 303b.

In some implementations, the third semiconductor layer 303c can include the second dopant. A concentration of the second dopant in the third semiconductor layer 303c can range from $1\times10^{18}$ atoms/cm$^3$ to $3\times10^{21}$ atoms/cm$^3$. A thickness of the third semiconductor layer 303c can range from 10-300 nm, preferably 50-150 nm. In some implementations, the third tunnel oxide layer 302c can include the second dopant. A concentration of the second dopant in the third tunnel oxide layer 302c can range from $1\times10^{18}$ atoms/ cm$^3$ to $3\times10^{21}$ atoms/cm$^3$.

Figure 4A:
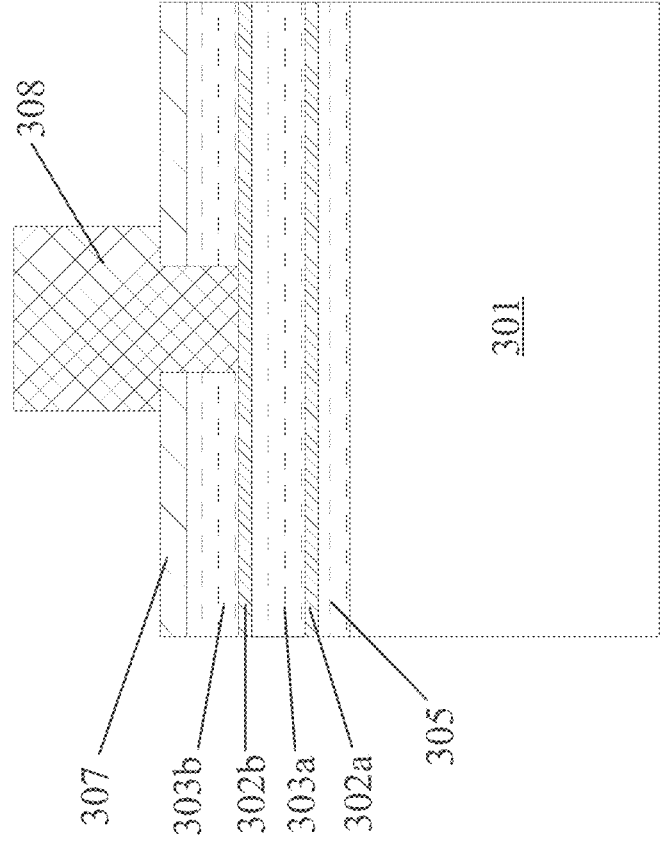
FIGS. 4A-4D illustrate examples of a first electrode of a solar cell, according to the present disclosure.
Figure 4B:
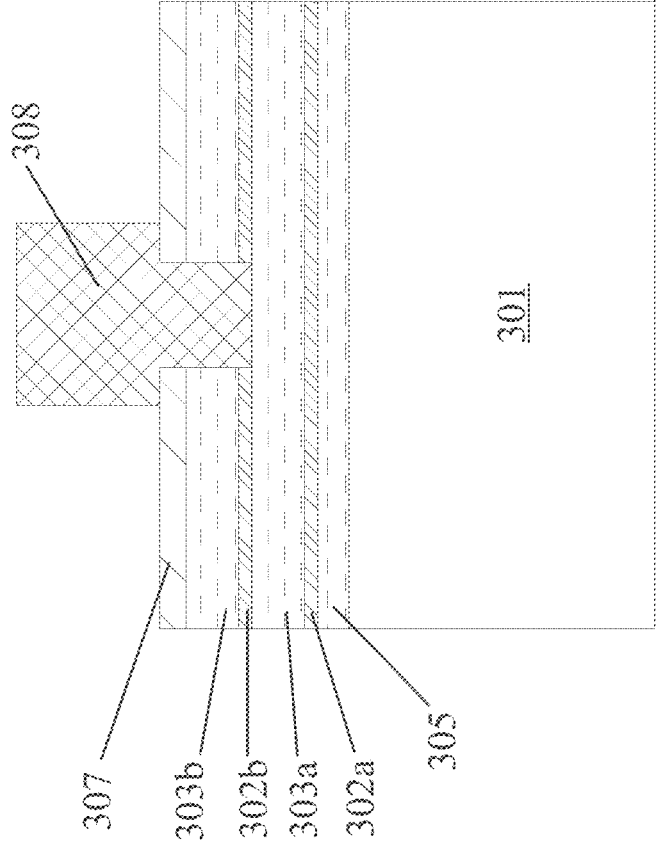
Figure 4C:
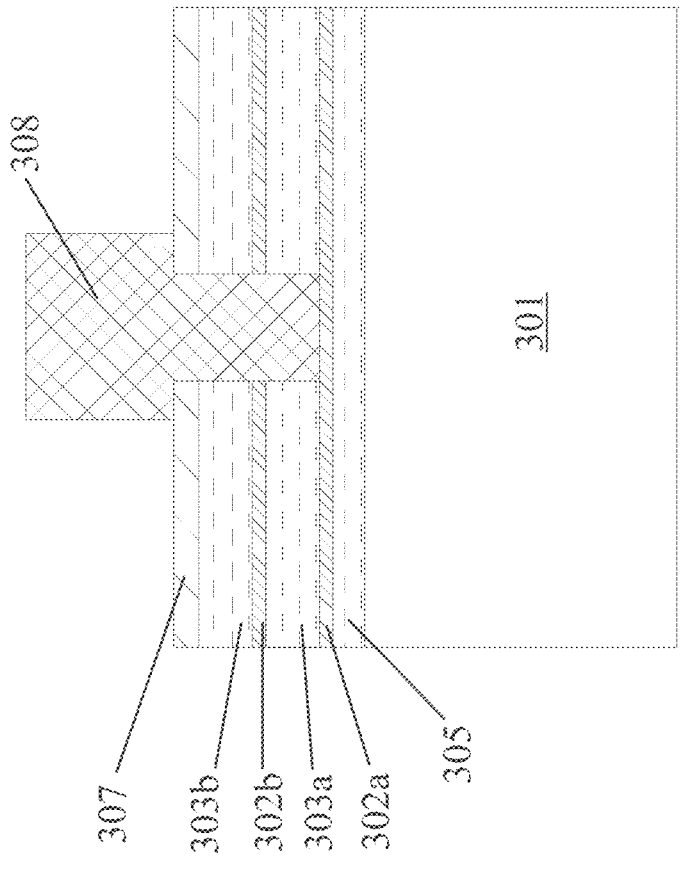
Figure 4D:
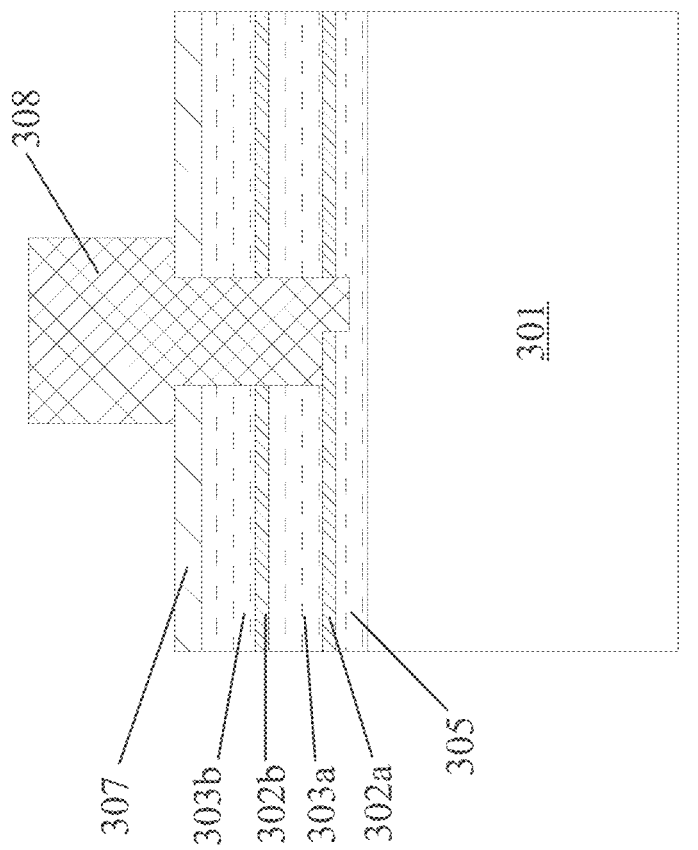

In some implementations, as shown in FIG. 3L, the first electrode 308 can extend through the passivation layer 307 to reach the second semiconductor layer 303b. In some implementations, the first electrode 308 can extend through the passivation layer 307 and the second semiconductor layer 303b to reach the second tunnel oxide layer 302b, as shown in FIG. 4A; extend through the passivation layer 307, the second semiconductor layer 303b and the second tunnel oxide layer 302b to reach the first semiconductor layer 303a, as shown in FIG. 4B; or extend through the passivation layer 307, the second semiconductor layer 303b, and the second tunnel oxide layer 302b, the first semiconductor layer 303a to reach the first tunnel oxide layer 302a, as shown in FIG. 4C. In some implementations, as shown in FIG. 4D, a portion of the bottom of the first electrode 308 can further extend through the first tunnel oxide layer 302a to reach the first doped region 305.

Figure 5A:
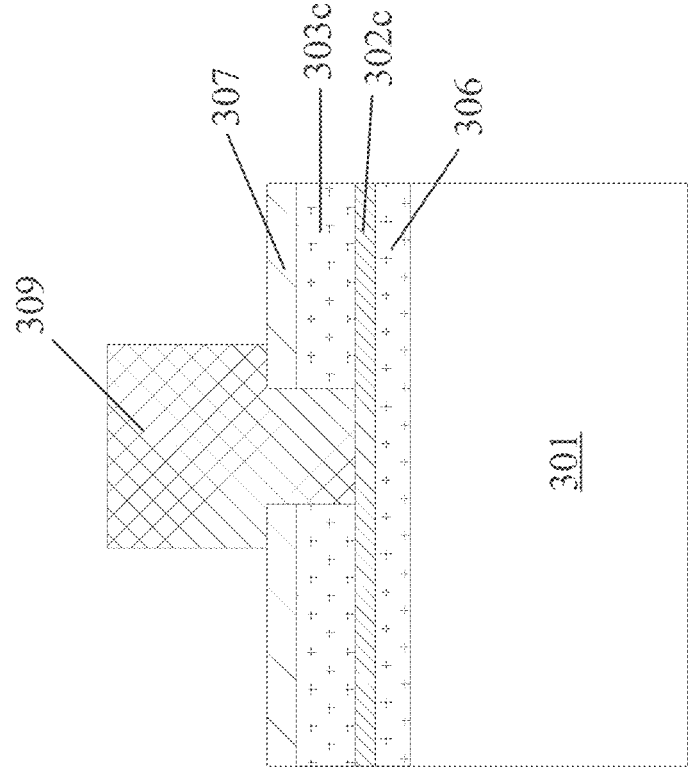
FIGS. 5A-5B illustrate examples of a second electrode of a solar cell, according to the present disclosure.
Figure 5B:
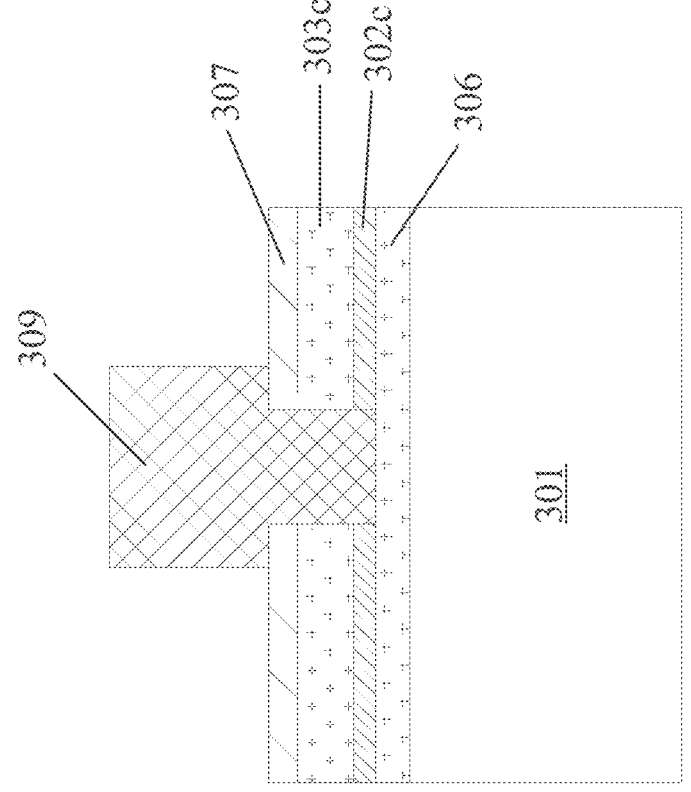

In some implementations, as shown in FIG. 3L, the second electrode 309 can extend through the passivation layer 307 to reach the third semiconductor layer 303c. In some implementations, the second electrode 309 can extend through the passivation layer 307 and the third semiconductor layer 303c to reach the third tunnel oxide layer 302c, as shown in FIG. 5A, or extend through the passivation layer 307, the third semiconductor layer 303c and the third tunnel oxide layer 302c to reach the second doped region 306, as shown in FIG. 5B.

The steps of the method as shown in FIGS. 3A-5B may not be exhaustive and the other steps can be performed as well before, after, or in between any of the illustrated steps. Further, some of the steps may be performed simultaneously, or in a different order than shown in FIGS. 3A-5B.

EMBODIMENT

Experimental methods used in the following embodiments are all conventional methods unless there are special requirements.

Unless otherwise specified, materials, reagents, and the like in the following embodiments are all commercially available.

Embodiment 1

The solar cell in this embodiment is the first solar cell, and this embodiment includes the following steps:

Step 1: Provide a semiconductor substrate 1.

A P-type silicon wafer is provided as the semiconductor substrate 1 with a thickness of 200 μm.

Step 2: Form a first doped layer 3 on a surface of a side of the semiconductor substrate 1.

Specifically, a first interface layer 2 is formed on a surface of a side of the semiconductor substrate 1 through a low pressure chemical vapor deposition (LPCVD) method at a temperature of 700° C., and a phosphorus-doped amorphous silicon layer 3 is formed on a surface of a side of the first interface layer 2 facing away from the semiconductor substrate 1. The phosphorus-doped amorphous silicon layer 3 is formed through in-situ doping and the LPCVD method, where a deposition source is $SiH_4$, and a phosphorus-containing doping source is $PH_3$.

The first interface layer 2 is a silicon oxide layer with a thickness of 1 nm, and a thickness of an intrinsic amorphous silicon layer is 100 nm.

In the first doped layer 3, a peak doping concentration of a first dopant is $3 \times 10^{21}$ atoms/cm$^3$.

Step 3: Pattern the first doped layer 3 to retain a part of the first doped layer 3.

Specifically, a silicon oxide layer (that is, a first auxiliary layer) with a thickness of 20 nm is formed on a surface of a side of the first doped layer 3 facing away from the semiconductor substrate 1, and etching is then performed on the silicon oxide, the first doped layer 3, and the first interface layer 2 on the second region by using short-pulse laser, to complete patterning and retain the first doped layer 3 in the first region only.

Step 4: Form a silicon oxide layer (that is, a second auxiliary layer) with a thickness of 20 nm covering the first doped layer 3 and a surface of the semiconductor substrate 1 not covered by the first doped layer 3 on a surface of a side of the first doped layer 3 facing away from the semiconductor substrate 1.

Step 5: Form a second doped layer 6 on a surface of a side of a second interface layer 4 facing away from the semiconductor substrate 1 and the first doped layer 3 through in-situ doping and the LPCVD method, where the in-situ doping refers to that deposition and doping of amorphous silicon are completed simultaneously, a thickness of the second doped layer 6 is 25 nm, and a boron-containing doping source of the in-situ doping is $B_2H_6$, to form the second doped layer 6. Heating treatment (a peak temperature is 900° C. and a heating duration is 30 min) is then performed on the second doped layer 6 on the first doped layer 3, so that phosphorus in the first doped layer 3 is diffused into the second doped layer 6 on the first doped layer, and boron in the second doped layer 6 on the first region is also diffused into the first doped layer 3, to transform the corresponding second doped layer 6 on the first region into a third doped layer 5. The corresponding second doped layer 6 on the second region is still the second doped layer 6, and due to a high temperature of the heating treatment, the amorphous silicon layer is transformed into a polysilicon layer. Conductivity types of all regions in the third doped layer 5 are all the same as the conductivity type of the first doped layer 3.

In the first doped layer 3, a peak doping concentration of phosphorus is $2 \times 10^{21}$ atoms/cm$^3$, and a peak doping concentration of boron is $2 \times 10^{19}$ atoms/cm$^3$.

In the third doped layer 5, a peak doping concentration of phosphorus is $2 \times 10^{21}$ atoms/cm$^3$, and a peak doping concentration of boron is $2 \times 10^{19}$ atoms/cm$^3$.

The thickness of the second doped layer 6 is 25 nm, and a doping concentration of boron in the second doped layer is $2 \times 10^{19}$ atoms/cm$^3$.

Step 6: Form a back passivation layer 7 (an aluminum oxide layer with a thickness of 15 nm) on the third doped layer 5 and a surface of a side of the second doped layer 6 facing away from the second interface layer 4, and form a front passivation layer (an aluminum oxide layer with a thickness of 15 nm) on a surface of a side of the semiconductor substrate 1 facing away from a first interface layer 2.

Step 7: Form a first electrode 8 extending through the back passivation layer 7 on the third doped layer 5, and form a second electrode 9 extending through the back passivation layer 7 on the second doped layer 6. Both the first electrode 8 and the second electrode 9 are silver electrodes.

Performance of the solar cell is shown in Table 1.

Embodiment 2

The solar cell in this embodiment is the second solar cell, and this embodiment includes the following steps:

Step 1: Provide a semiconductor substrate 1.

A P-type silicon wafer is provided as the semiconductor substrate 1 with a thickness of 200 μm.

Step 2: Form a first doped layer 3 on a surface of a side of the semiconductor substrate 1. Specifically, a first interface layer 2 is formed on a surface of a side of the semiconductor substrate 1 through a low pressure chemical vapor deposition (LPCVD) method at a temperature of 700° C., and a phosphorus-doped amorphous silicon layer 3 is formed on a surface of a side of the first interface layer 2 facing away from the semiconductor substrate 1. The phosphorus-doped amorphous silicon layer is formed through in-situ doping and the LPCVD method, where a deposition source is $SiH_4$, and a phosphorus-containing doping source is $PH_3$.

The first interface layer 2 is a silicon oxide layer with a thickness of 1 nm, and a thickness of an intrinsic amorphous silicon layer is 100 nm.

In the first doped layer 3, a peak doping concentration of a first dopant is $3 \times 10^{21}$ atoms/cm$^3$.

Step 3: Pattern the first doped layer 3 to retain a part of the first doped layer 3.

Specifically, a silicon oxide layer (that is, a first auxiliary layer) with a thickness of 20 nm is formed on a surface of a side of the first doped layer 3 facing away from the semiconductor substrate 1, and etching is then performed on the silicon oxide, the first doped layer 3, and the first interface layer 2 on the second region by using short-pulse laser, to complete patterning and retain the first doped layer 3 in the first region only.

Step 4: Form a silicon oxide layer (that is, a second auxiliary layer) with a thickness of 20 nm covering the first doped layer 3 and a surface of the semiconductor substrate 1 not covered by the first doped layer 3 on a surface of a side of the first doped layer 3 facing away from the semiconductor substrate 1.

Step 5: Form a second doped layer 6 on a surface of a side of a second interface layer 4 facing away from the semiconductor substrate 1 and the first doped layer 3 through in-situ doping and the LPCVD method, where the in-situ doping refers to that deposition and doping of amorphous silicon are completed simultaneously, a thickness of the second doped layer 6 is 25 nm, and a boron-containing doping source of the in-situ doping is $B_2H_6$, to form the second doped layer 6. Heating treatment (a peak temperature is 900° C. and a heating duration is 30 min) is then performed on the second doped layer 6 on the first doped layer 3, so that phosphorus in the first doped layer 3 is diffused into the second doped layer 6 on the first doped layer, and boron in the second doped layer 6 on the first region is also diffused into the first doped layer 3, to transform the corresponding second doped layer 6 on the first region into a third doped layer 5. The corresponding second doped layer 6 on the second region is still the second doped layer 6, and due to a high temperature of the heating treatment, the amorphous silicon layer is transformed into a polysilicon layer. Conductivity types of all regions in the third doped layer 5 are all the same as the conductivity type of the first doped layer 3.

In the first doped layer 3, a peak doping concentration of phosphorus is $2\times10^{21}$ atoms/cm³, and a peak doping concentration of boron is $2\times10^{19}$ atoms/cm³.

In the third doped layer 5, a peak doping concentration of phosphorus is $2\times10^{21}$ atoms/cm³, and a peak doping concentration of boron is $2\times10^{19}$ atoms/cm³.

The thickness of the second doped layer 6 is 25 nm, and a doping concentration of boron in the second doped layer is $2\times10^{19}$ atoms/cm³.

Step 6: Form a second auxiliary layer on the third doped layer 5 and a surface of a side of the second doped layer 6 facing away from the second interface layer 4 respectively, where the second auxiliary layer does not cover a position close to a junction of the third doped layer 5 and the second doped layer 6.

The second auxiliary layer may be silicon oxide with a thickness of 20 nm.

Step 7: Perform etching on the third doped layer 5, the second doped layer 6, and the second interface layer 4 below the second doped layer and the third doped layer that are not covered by the second auxiliary layer by using short-pulse laser, to expose the semiconductor substrate 1 (the exposed semiconductor substrate 1 is referred to as an isolation region 10), where an isolation region 10 is formed on the third doped layer 5, the second interface layer 4, the first doped layer 3, a side surface of a first interface layer 2 close to the isolation region 10, a surface of the semiconductor substrate 1 close to the isolation region 10, the second interface layer 4, and a side surface of the second doped layer 6 close to the isolation region 10, and a width w of the isolation region 10 is 100 μm.

After the etching step is completed, the second auxiliary layer is removed, where the second auxiliary layer is removed by using a dilute hydrofluoric acid solution.

Step 8: Form a back passivation layer 7 (an aluminum oxide layer with a thickness of 15 nm) on the third doped layer 5 and a surface of a side of the second doped layer 6 facing away from the second interface layer 4, and form a front passivation layer (an aluminum oxide layer with a thickness of 15 nm) on a surface of a side of the semiconductor substrate 1 facing away from the first interface layer 2.

Step 9: Form a first electrode 8 extending through the back passivation layer 7 on the third doped layer 5, and form a second electrode 9 extending through the back passivation layer 7 on the second doped layer 6. Both the first electrode 8 and the second electrode 9 are silver electrodes.

Performance of the solar cell is shown in Table 1.

Embodiment 3

Differences between Embodiment 3 and Embodiment 2 lie in that, thicknesses of the second doped layer 6 are different, where the thickness of the second doped layer 6 in this embodiment is 50 nm, and conductivity types of some regions in the third doped layer 5 are the same as the conductivity type of the first doped layer 3. Performance of the solar cell is shown in Table 1.

Embodiment 4

Differences between Embodiment 4 and Embodiment 2 lie in that, thicknesses of the second doped layer 6 are different, where the thickness of the second doped layer 6 in this embodiment is 100 nm, and conductivity types of some regions in the third doped layer 5 are the same as the conductivity type of the first doped layer 3. Performance of the solar cell is shown in Table 1.

Embodiment 5

A different between Embodiment 5 and Embodiment 2 lies in Step 5, where Step 5 in Embodiment 5 is: forming an amorphous silicon layer with a thickness of 25 nm on a surface of a side of a second interface layer 4 facing away from the semiconductor substrate 1 and the first doped layer 3, and doping boron into the amorphous silicon layer through boron diffusion, where a boron-containing doping source is $BBr_3$, a peak temperature of the boron diffusion is 900° C., and a heating duration is 30 min, to form the second doped layer 6. In addition, phosphorus in the first doped layer is diffused into the second doped layer 6 on the first doped layer, and boron in the second doped layer 6 on the first region is also diffused into the first doped layer 3, to transform the corresponding second doped layer 6 on the first region into a third doped layer 5. The corresponding second doped layer 6 on the second region is still the second doped layer 6, and due to a high temperature of the boron diffusion, the amorphous silicon layer is transformed into a polysilicon layer. Conductivity types of all regions in the third doped layer 5 are all the same as the conductivity type of the first doped layer 3.

In the first doped layer 3, a peak doping concentration of phosphorus is $2\times10^{21}$ atoms/cm³, and a peak doping concentration of boron is $2\times10^{19}$ atoms/cm³.

In the third doped layer 5, a peak doping concentration of phosphorus is $2\times10^{21}$ atoms/cm³, and a peak doping concentration of boron is $2\times10^{19}$ atoms/cm³.

The thickness of the second doped layer 6 is 25 nm, and a doping concentration of boron in the second doped layer is $2\times10^{19}$ atoms/cm³.

Performance of the solar cell is shown in Table 1.

Embodiment 6

Differences between Embodiment 6 and Embodiment 2 lie in the following steps:

Step 5: Form a second doped layer 6 on a surface of a side of a second interface layer 4 facing away from the semiconductor substrate 1 and the first doped layer 3 through in-situ doping and the LPCVD method, where the in-situ doping refers to that deposition and doping of amorphous silicon are completed simultaneously, a thickness of the second doped layer 6 is 25 nm, and a boron-containing doping source of the in-situ doping is $B_2H_6$, to form the second doped layer 6.

Step 6: Form a second auxiliary layer on the third doped layer 5 and a surface of a side of the second doped layer 6 facing away from the second interface layer 4 respectively, where the second auxiliary layer does not cover a position close to a junction of the third doped layer 5 and the second doped layer 6.

The second auxiliary layer may be silicon oxide with a thickness of 20 nm.

Step 7: Perform etching on the third doped layer 5, the second doped layer 6, and the second interface layer 4 below the second doped layer and the third doped layer that are not covered by the second auxiliary layer by using short-pulse laser, to expose the semiconductor substrate 1 (the exposed semiconductor substrate 1 is referred to as an isolation region 10), where an isolation region 10 is formed on the third doped layer 5, the second interface layer 4, the first doped layer 3, a side surface of a first interface layer 2 close to the isolation region 10, a surface of the semiconductor substrate 1 close to the isolation region 10, the second interface layer 4, and a side surface of the second doped layer 6 close to the isolation region 10, and a width w of the isolation region 10 is 100 μm.

After the etching step is completed, the second auxiliary layer is removed, where the second auxiliary layer is removed by using a dilute hydrofluoric acid solution.

Step 8: Perform heating treatment (a peak temperature is 900° C. and a heating duration is 30 min) on the second doped layer 6 on the first doped layer 3, so that phosphorus in the first doped layer 3 is diffused into the second doped layer 6 on the first doped layer, and boron in the second doped layer 6 on the first region is also diffused into the first doped layer 3, to transform the corresponding second doped layer 6 on the first region into a third doped layer 5. The corresponding second doped layer 6 on the second region is still the second doped layer 6, and due to a high temperature of the heating treatment, the amorphous silicon layer is transformed into a polysilicon layer. Conductivity types of all regions in the third doped layer 5 are all the same as the conductivity type of the first doped layer 3.

In the first doped layer 3, a peak doping concentration of phosphorus is $2\times10^{21}$ atoms/cm³, and a peak doping concentration of boron is $2\times10^{19}$ atoms/cm³.

In the third doped layer 5, a peak doping concentration of phosphorus is $2\times10^{21}$ atoms/cm³, and a peak doping concentration of boron is $2\times10^{19}$ atoms/cm³.

The thickness of the second doped layer 6 is 25 nm, and a doping concentration of boron in the second doped layer is $2\times10^{19}$ atoms/cm³.

Step 9: Form a back passivation layer 7 (an aluminum oxide layer with a thickness of 15 nm) on the third doped layer 5 and a surface of a side of the second doped layer 6 facing away from the second interface layer 4, and form a front passivation layer (an aluminum oxide layer with a thickness of 15 nm) on a surface of a side of the semiconductor substrate 1 facing away from the first interface layer 2.

Step 10: Form a first electrode 8 extending through the back passivation layer 7 on the third doped layer 5, and form a second electrode 9 extending through the back passivation layer 7 on the second doped layer 6. Both the first electrode 8 and the second electrode 9 are silver electrodes.

Performance of the solar cell is shown in Table 1.

Embodiment 7

Differences between Embodiment 7 and Embodiment 2 lie in that, thicknesses of the second doped layer 6 are different, where the thickness of the second doped layer 6 in this embodiment is 200 nm, and conductivity types of some regions in the third doped layer 5 are the same as the conductivity type of the first doped layer 3.

Performance of the solar cell is shown in Table 1.

Embodiment 8

A difference between Embodiment 8 and Embodiment 2 lies in Step 5, where Step 5 in Embodiment 8 is: forming a boron-containing polysilicon layer on a surface of a side of a second interface layer 4 facing away from the semiconductor substrate 1 and the first doped layer 3 through in-situ doping, where $B_2H_6$ is used as a doping source in an in-situ doping process, and a thickness of the formed polysilicon layer is 100 nm, to form the second doped layer 6. Laser is then used to locally irradiate the first region of the second doped layer 6 on the first doped layer 3 (laser power of the laser treatment is 25 W, and a green light laser emitter with a wavelength of 532 nm is used for the laser treatment), so that phosphorus in the first doped layer 3 is diffused into the first region of the second doped layer 6 on the first doped layer, and boron in the second doped layer 6 on the first region is also diffused into the first doped layer 3, to transform the corresponding second doped layer 6 on the first region into a third doped layer 5. In a region irradiated by the laser in the third doped layer 5, a doping concentration of the first dopant is greater than a doping concentration of the second dopant, and a conductivity type of the region is the same as the conductivity type of the first doped layer 3. The corresponding second doped layer 6 on the second region and not irradiated by the laser is still the second doped layer 6, the first region is a first electrode region, and a conductivity of each region in contact with the first electrode in the third doped layer 5 is the same as the conductivity type of the first doped layer 3.

In the first doped layer 3, a peak doping concentration of phosphorus is $2\times10^{21}$ atoms/cm³, and a peak doping concentration of boron is $2\times10^{19}$ atoms/cm³.

In the third doped layer 5, a peak doping concentration of phosphorus is $2\times10^{21}$ atoms/cm³, and a peak doping concentration of boron is $2\times10^{19}$ atoms/cm³.

The thickness of the second doped layer 6 is 100 nm, and a doping concentration of boron in the second doped layer is $2\times10^{19}$ atoms/cm³.

Performance of the solar cell is shown in Table 1.

TABLE 1

| | Including isolation region or not | Thickness of second doped layer/nm | Energy conversion efficiency Eff/% | Open-circuit voltage Voc/mV | Short-circuit current density Jsc/mA/cm$^2$ | Fill factor FF/% |
|---|---|---|---|---|---|---|
| Embodiment 1 | No | 25 | 25.40% | 733 | 42.15 | 82.22 |
| Embodiment 2 | Yes | 25 | 25.68% | 736 | 42.12 | 82.84 |
| Embodiment 3 | Yes | 50 | 25.89% | 737 | 42.27 | 83.09 |
| Embodiment 4 | Yes | 100 | 25.77% | 735 | 42.21 | 83.05 |
| Embodiment 5 | Yes | 25 | 25.70% | 735 | 42.18 | 82.89 |
| Embodiment 6 | Yes | 25 | 25.63% | 736 | 42.19 | 82.73 |
| Embodiment 7 | Yes | 200 | 25.18% | 735 | 42.06 | 81.44 |
| Embodiment 8 | Yes | 100 | 25.83% | 737 | 42.20 | 83.27 |

In summary, as can be known from Table 1, it may be known from comparison between Embodiment 1 and Embodiment 2 that, an isolation region between P-type regions and N-type regions is formed on the solar cell, to isolate P-type semiconductor regions from N-type semiconductor regions, so that recombination at a PN junction is reduced, lateral current leakage is reduced, and both the open-circuit voltage and the fill factor are improved to some extent.

It may be known from comparison between Embodiment 2 and Embodiment 5 that, in Embodiment 5, boron diffusion is used to replace in-situ doping and boron diffusion, and a surface concentration of the boron diffusion is slightly greater than a boron concentration of the in-situ doping, so that contact resistance may be reduced, the fill factor may be improved to some extent, the open-circuit voltage is slightly reduced, and the energy conversion efficiency of Embodiment 5 is close to the energy conversion efficiency of Embodiment 2.

It may be known from comparison among Embodiment 2, Embodiment 3, Embodiment 4, and Embodiment 7, the energy conversion efficiency of Embodiment 3 is the highest. A main reason lies in that: In Embodiment 2, the thickness of the second doped layer is 25 nm, although the third doped layer is totally inversed and becomes an N-type doped layer, due to the relatively thin thickness (which is also 25 nm) of the second doped layer, the second doped layer cannot totally shield metal recombination of the second electrode. Therefore, the open-short circuit in Embodiment 2 is slightly lower than that is Embodiment 3. In Embodiment 4, the thickness of the second doped layer is 100 nm, only a bottom layer of the third doped layer is inversed and becomes an N-type doped layer, some of top layers of the third doped layer are still a P-type doped layer, the first electrode extends through a surface layer of the third doped layer to form contact with the N-type third doped layer at the bottom layer, so that the fill factor in Embodiment 4 is slightly lower than that in Embodiment 3. In Embodiment 7, the thickness of the second doped layer is 200 nm, and because the third doped layer is relatively thick, contact between the first electrode and the N-type bottom layer of the third doped layer is poor, affecting the fill factor in Embodiment 7.

It may be known from comparison between Embodiment 2 and Embodiment 6 that, there is a little difference between a manner of first forming an isolation region and then performing heating and a manner of first performing heating and then forming an isolation region, and electrical performance in Embodiment 2 is also close to electrical performance in Embodiment 6.

Compared with Embodiment 4, in Embodiment 8, heating continues to be performed in the electrode region through laser, so that a top P-type polysilicon layer below the electrode is transformed into an N-type polysilicon layer, better contact is formed between the first electrode and the N-type doped semiconductor, and the fill factor is improved.

Therefore, patterning needs to be performed once only and high-temperature heat treatment also needs to be performed once only to fabricate the solar cell described in the preset disclosure. In addition, doped regions fabricated by using this method have passivated contact structures at both electrodes, bringing a good passivation effect and greatly reducing a recombination rate in metal regions, thereby improving the efficiency of the solar cell. In addition, thermal damage caused by the high-temperature heat treatment may also be reduced.

Although the implementations of the present disclosure are described above, the present disclosure is not limited to the foregoing specific implementations and application fields, and the foregoing specific implementation solutions are merely exemplary and instructive rather than limitative. A person of ordinary skill in the art may further make, under the teaching of this specification, various forms without departing from the protection scope of the claims of the present disclosure.

What is claimed is:

1. A solar cell, comprising:

a substrate;

a first doped layer arranged on a first surface of the substrate in a first region of the substrate, wherein the first doped layer comprises a first dopant;

a second doped layer arranged on the first surface of the substrate in a second region of the substrate, wherein the second doped layer comprises a second dopant, and wherein a conductivity type of the second doped layer is opposite to a conductivity type of the first doped layer;

a third doped layer arranged on the first doped layer, wherein the third doped layer comprises the first dopant, wherein the first doped layer, the second doped layer, and the third doped layer each comprises one of a polysilicon layer, a microcrystalline silicon layer, or an amorphous silicon layer; and a first interface layer between the substrate and the first doped layer; and a second interface layer between the first doped layer and the third doped layer, wherein the first interface layer and the second interface layer comprise a dielectric material.

2. The solar cell according to claim 1, wherein the first doped layer further comprises the second dopant, wherein, a direction from a surface of the first doped layer facing away from the substrate to a surface of the first doped layer facing the substrate:

a doping concentration of the first dopant in the first doped layer increases and then decreases; and a doping concentration of the second dopant in the first doped layer decreases.

3. The solar cell according to claim 1, wherein the third doped layer further comprises the second dopant, and wherein a conductivity type of at least a portion of the third doped layer is the same as the conductivity type of the first doped layer.

4. The solar cell according to claim 1, wherein a thickness of the third doped layer is greater than a thickness of the first doped layer.

5. The solar cell according to claim 1, wherein, in a direction from a surface of the third doped layer facing away from the substrate to a surface of the third doped layer facing the substrate:

a doping concentration of the first dopant in the third doped layer increases; and a doping concentration of the second dopant in the third doped layer remains consistent.

6. The solar cell according to claim 1, wherein the third doped layer comprises:

a first portion that covers a surface of the first doped layer facing away from the substrate; and a second portion that covers a side surface of the first doped layer close to the second doped layer, wherein the second portion of the third doped layer is in contact with the second doped layer.

7. The solar cell according to claim 1, further comprising an isolation region arranged between the first region and the second region, wherein the first doped layer and the second doped layer are separated by an isolating structure in the isolating region.

8. The solar cell according to claim 1, further comprising:

a passivation layer arranged on top of the second doped layer and the third doped layer.

9. The solar cell according to claim 8, further comprising:

a first electrode in the first region, wherein the first electrode is coupled to one of the first doped layer or the third doped layer; and a second electrode in the second region, wherein the second electrode is coupled to the second doped layer.

* * * * *